(12) United States Patent
Saito et al.

(10) Patent No.: US 9,508,559 B2
(45) Date of Patent: Nov. 29, 2016

(54) SEMICONDUCTOR WAFER AND METHOD FOR MANUFACTURING SEMICONDUCTOR DEVICE

(71) Applicant: FUJITSU SEMICONDUCTOR LIMITED, Yokohama, Kanagawa (JP)

(72) Inventors: Shoko Saito, Nagoya (JP); Tomoyuki Okada, Akiruno (JP); Kanji Takeuchi, Setagaya (JP); Mitsufumi Naoe, Akiruno (JP); Masahiko Minemura, Kawasaki (JP); Yukihiro Sato, Akiruno (JP); Yoshito Konno, Niiza (JP); Yasuhiko Inada, Hachioji (JP); Tomoaki Inaoka, Yokohama (JP); Naoya Sashida, Kuwana (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/030,662

(22) Filed: Sep. 18, 2013

(65) Prior Publication Data
US 2014/0110712 A1   Apr. 24, 2014

(30) Foreign Application Priority Data

Oct. 22, 2012  (JP) ................. 2012-232799

(51) Int. Cl.
*G01R 31/28* (2006.01)
*H01L 29/00* (2006.01)
(Continued)

(52) U.S. Cl.
CPC ....... *H01L 21/308* (2013.01); *H01L 21/32139* (2013.01); *H01L 23/522* (2013.01);
(Continued)

(58) Field of Classification Search
CPC ....... H01L 22/34; H01L 22/20; H01L 22/12; H01L 22/26; H01L 23/544; G01R 31/2856; G01R 31/2884; G01R 31/2831
USPC .......................... 257/48; 438/11, 14, 15, 18
See application file for complete search history.

(56) References Cited

U.S. PATENT DOCUMENTS

2002/0104991 A1* 8/2002 Cleeves et al. ................. 257/48
2005/0093165 A1   5/2005 Morita
(Continued)

FOREIGN PATENT DOCUMENTS

JP   09-306910 A   11/1997
JP   2005-136135 A   5/2005
(Continued)

OTHER PUBLICATIONS

Office Action dated Jul. 11, 2016, issued in counterpart Japanese Patent Application No. 2012-232799, with English translation. (3 pages).

*Primary Examiner* — Trung Q Dang
*Assistant Examiner* — Didarul Mazumder
(74) *Attorney, Agent, or Firm* — Westerman, Hattori, Daniels & Adrian, LLP

(57) ABSTRACT

A semiconductor wafer including patterns transferred to a plurality of shot regions of the semiconductor wafer respectively, a plurality of chip regions being formed in the plurality of shot regions respectively, a plurality of first dummy patterns being formed respectively in a first chip region of the plurality of chip regions of each of the plurality of shot regions, the plurality of first dummy patterns being arranged repeatedly in a first manner, a plurality of second dummy patterns being formed respectively in a second chip region of the plurality of chip regions of each of the plurality of shot regions, the plurality of second dummy patterns being arranged repeatedly in a second manner different from the first manner.

11 Claims, 19 Drawing Sheets

(51) Int. Cl.
*H01L 21/308* (2006.01)
*H01L 21/3213* (2006.01)
*H01L 23/544* (2006.01)
*H01L 23/522* (2006.01)
*H01L 23/00* (2006.01)

(52) U.S. Cl.
CPC ............ *H01L23/544* (2013.01); *H01L 24/05* (2013.01); *H01L 2223/5442* (2013.01); *H01L 2223/54426* (2013.01); *H01L 2223/54453* (2013.01); *H01L 2224/02166* (2013.01); *H01L 2224/05556* (2013.01)

(56) References Cited

U.S. PATENT DOCUMENTS

| | | | |
|---|---|---|---|
| 2005/0161835 A1* | 7/2005 | Maeda | 257/786 |
| 2007/0048668 A1* | 3/2007 | Liegl | 430/311 |
| 2007/0293019 A1* | 12/2007 | Jeng et al. | 438/460 |
| 2008/0067690 A1* | 3/2008 | Kumagai | 257/774 |
| 2008/0096113 A1 | 4/2008 | Naoe | |
| 2008/0121881 A1* | 5/2008 | Kaneko et al. | 257/48 |
| 2009/0302486 A1* | 12/2009 | Terashima | H01L 23/544 257/797 |
| 2010/0224900 A1* | 9/2010 | Wu et al. | 257/98 |

FOREIGN PATENT DOCUMENTS

| | | |
|---|---|---|
| JP | 2007073725 A | 3/2007 |
| JP | 2008-053474 A | 3/2008 |
| JP | 2008-102360 A | 5/2008 |
| JP | 2008192809 A | 8/2008 |
| JP | 2009081243 A | 4/2009 |
| JP | 2009-111060 A | 5/2009 |

* cited by examiner

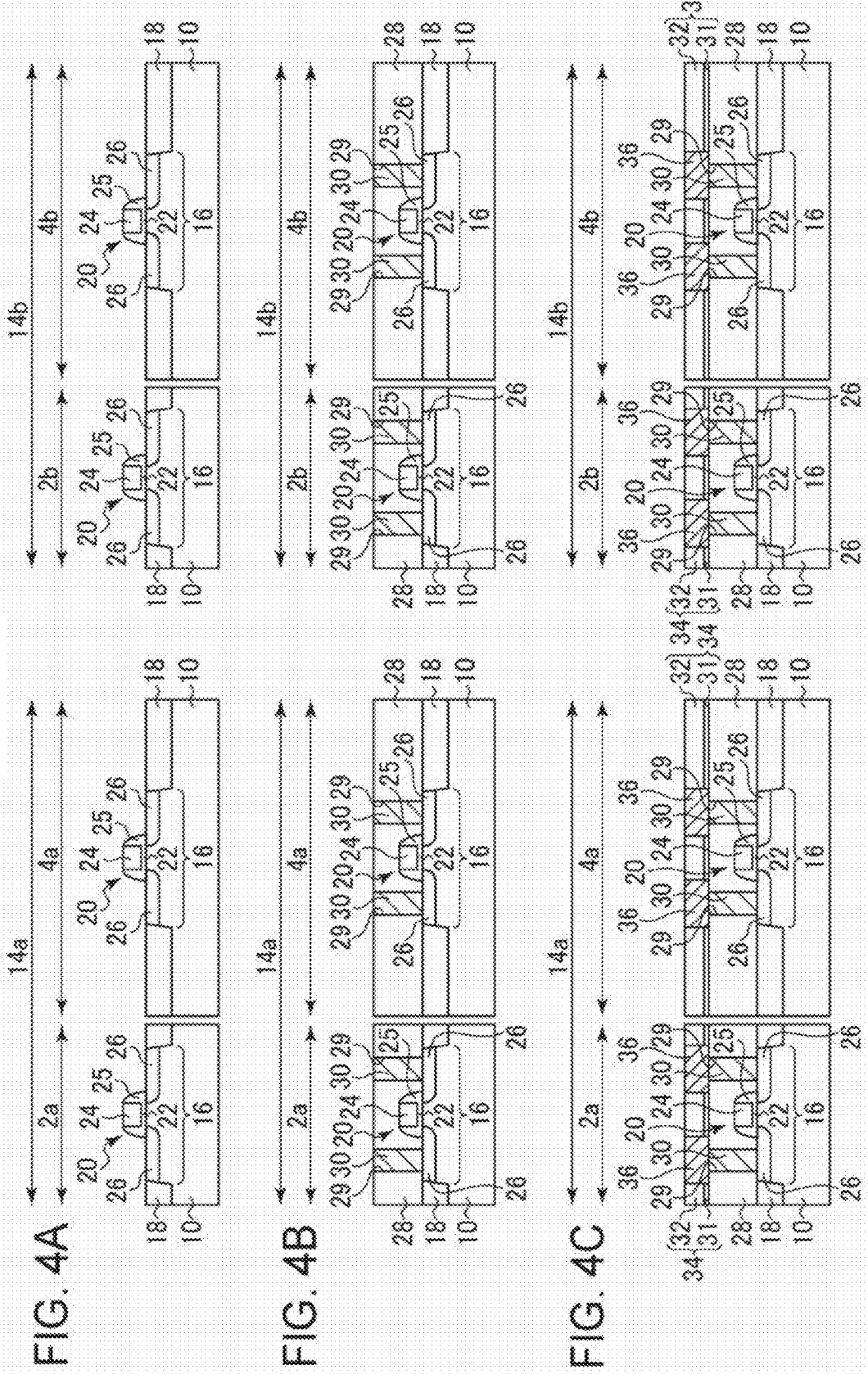

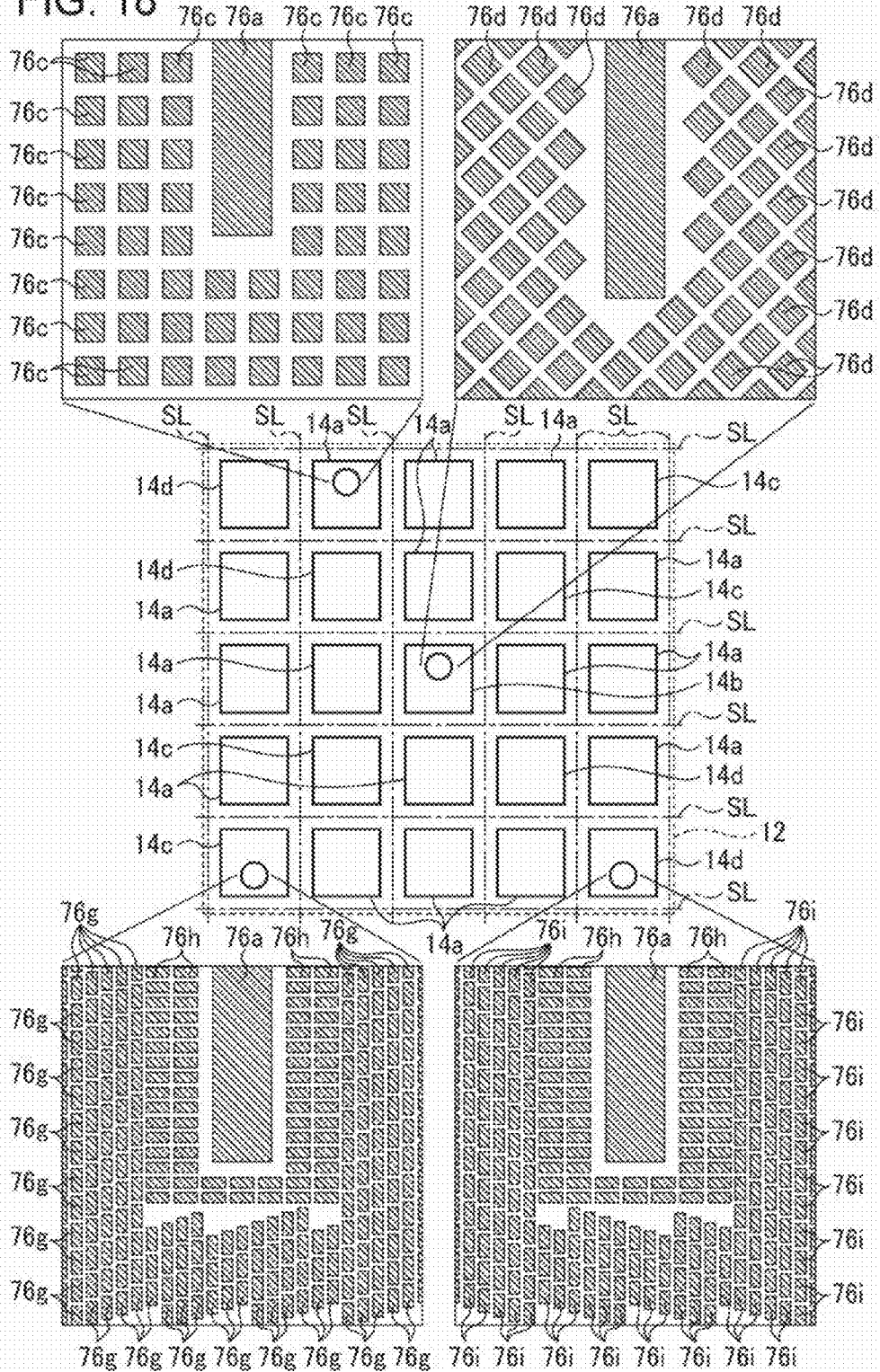

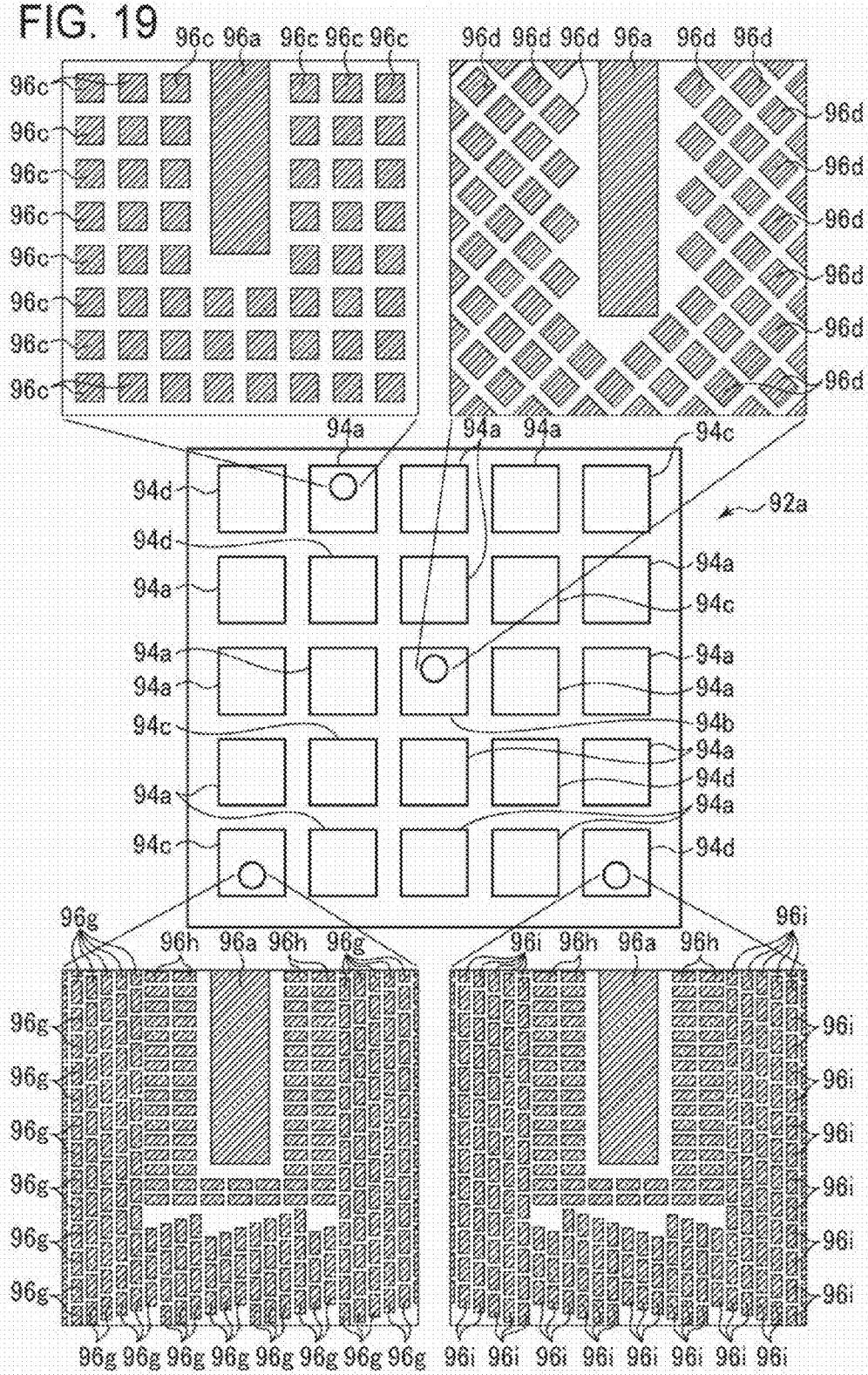

SEMICONDUCTOR WAFER AND METHOD FOR MANUFACTURING SEMICONDUCTOR DEVICE

CROSS-REFERENCE TO RELATED APPLICATION

This application is based upon and claims the benefit of priority of the prior Japanese Patent Application No. 2012-232799, filed on Oct. 22, 2012, the entire contents of which are incorporated herein by reference.

FIELD

The embodiments discussed herein are related to a semiconductor wafer and a method for manufacturing a semiconductor device.

BACKGROUND

A plurality of semiconductor chips are formed on a semiconductor wafer.

A test is made on a plurality of semiconductor chips formed on a semiconductor wafer on the stage prior to being diced into the semiconductor chips. Such test is called the Primary Test (PT).

In the Primary Test, first, a start chip (reference chip) which is the semiconductor chip to be tested first is determined. Starting from the start chip, the test is made sequentially on the plural semiconductor chips.

After the Primary Test has been made, the semiconductor wafer is diced along scribe lines into discrete chips.

The diced semiconductor chips are sequentially transferred, and when the diced semiconductor chips are transferred, it is important to detect the start chip in the Primary Test. The start chip in the Primary Test is detected, whereby the test results can correspond to the respective semiconductor chips.

Related references are as follows:
Japanese Laid-open Patent Publication No. 2008-53474;
Japanese Laid-open Patent Publication No. 2005-136135;
Japanese Laid-open Patent Publication No. 2008-102360; and
Japanese Laid-open Patent Publication No. Hei 9-306910.

SUMMARY

According to an aspect of the embodiments, a semiconductor wafer including patterns transferred to a plurality of shot regions of the semiconductor wafer respectively, a plurality of chip regions being formed in the plurality of shot regions respectively, a plurality of first dummy patterns being formed respectively in a first chip region of the plurality of chip regions of each of the plurality of shot regions, the plurality of first dummy patterns being arranged repeatedly in a first manner, a plurality of second dummy patterns being formed respectively in a second chip region of the plurality of chip regions of each of the plurality of shot regions, the plurality of second dummy patterns being arranged repeatedly in a second manner different from the first manner.

According to another aspect of the embodiments, a method for manufacturing a semiconductor device including exposing sequentially each of a plurality of shot region on a semiconductor wafer by using a reticle having a plurality of pattern regions, a plurality of first dummy patterns being arranged repeatedly in a first manner in a first pattern region of the plurality of pattern regions, and a plurality of second dummy patterns being arranged repeatedly in a second manner different from the first manner in a second pattern region of the plurality of pattern regions.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 4 to 8 and FIGS. 10 to 14 are sectional views of the semiconductor device in the steps of the method for manufacturing the semiconductor device according to the first embodiment, which illustrate the method;

FIG. 18 is a plan view of a part of a semiconductor wafer according to a second embodiment; and FIG. 19 is a plan view of a reticle used in a method for manufacturing a semiconductor device according to the second embodiment.

DESCRIPTION OF EMBODIMENTS

As diameters of semiconductor wafers become larger, and the chip sizes become smaller, the number of the semiconductor chips formed on the semiconductor wafer becomes larger, which makes it more difficult to identify the start chip.

[a] First Embodiment

The semiconductor wafer and the method for manufacturing a semiconductor device according to a first embodiment will be described with reference to FIGS. 1 to 14.

(Semiconductor Wafer)

First, the semiconductor wafer according to the present embodiment will be described with reference to FIGS. 1 to 3.

Figure 1:
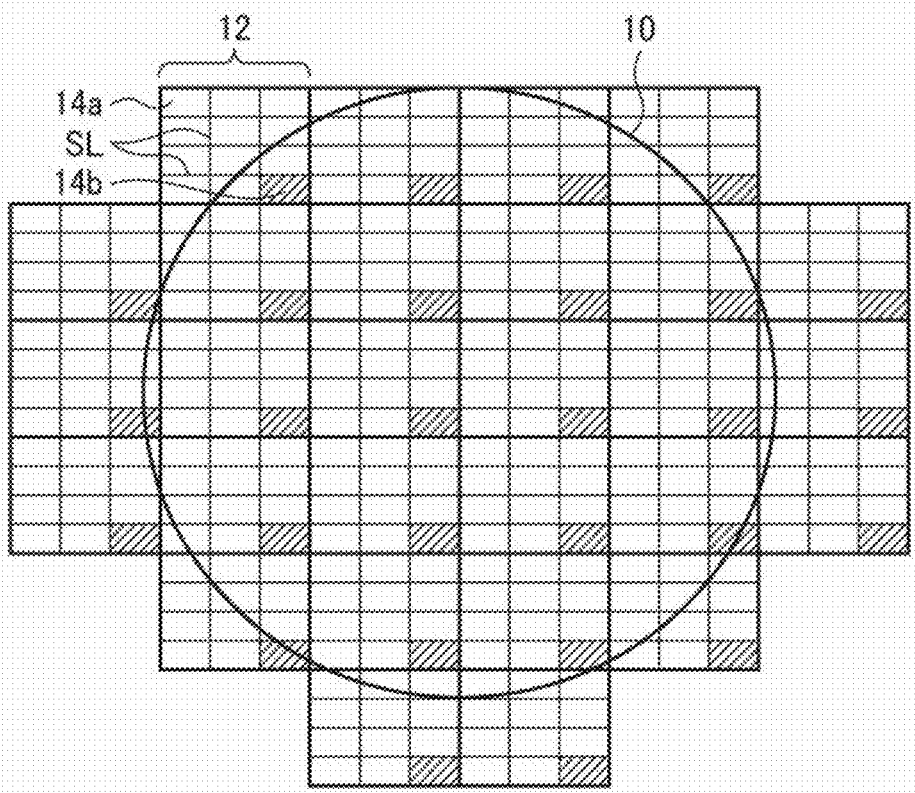
FIG. 1 is a plan view schematically illustrating relationships among the semiconductor wafer, shot regions and chip regions.

FIG. 1 is a plan view schematically illustrating the relationships among the semiconductor wafer, the shot regions and the chip regions.

As illustrated in FIG. 1, a plurality of shot regions (exposure shot regions) 12 are positioned on a semiconductor wafer 10. In FIG. 1, the shot regions 12 are defined by the thick solid lines. Each shot region 12 is exposed at once by one shot of exposure using a reticle.

Figure 2:
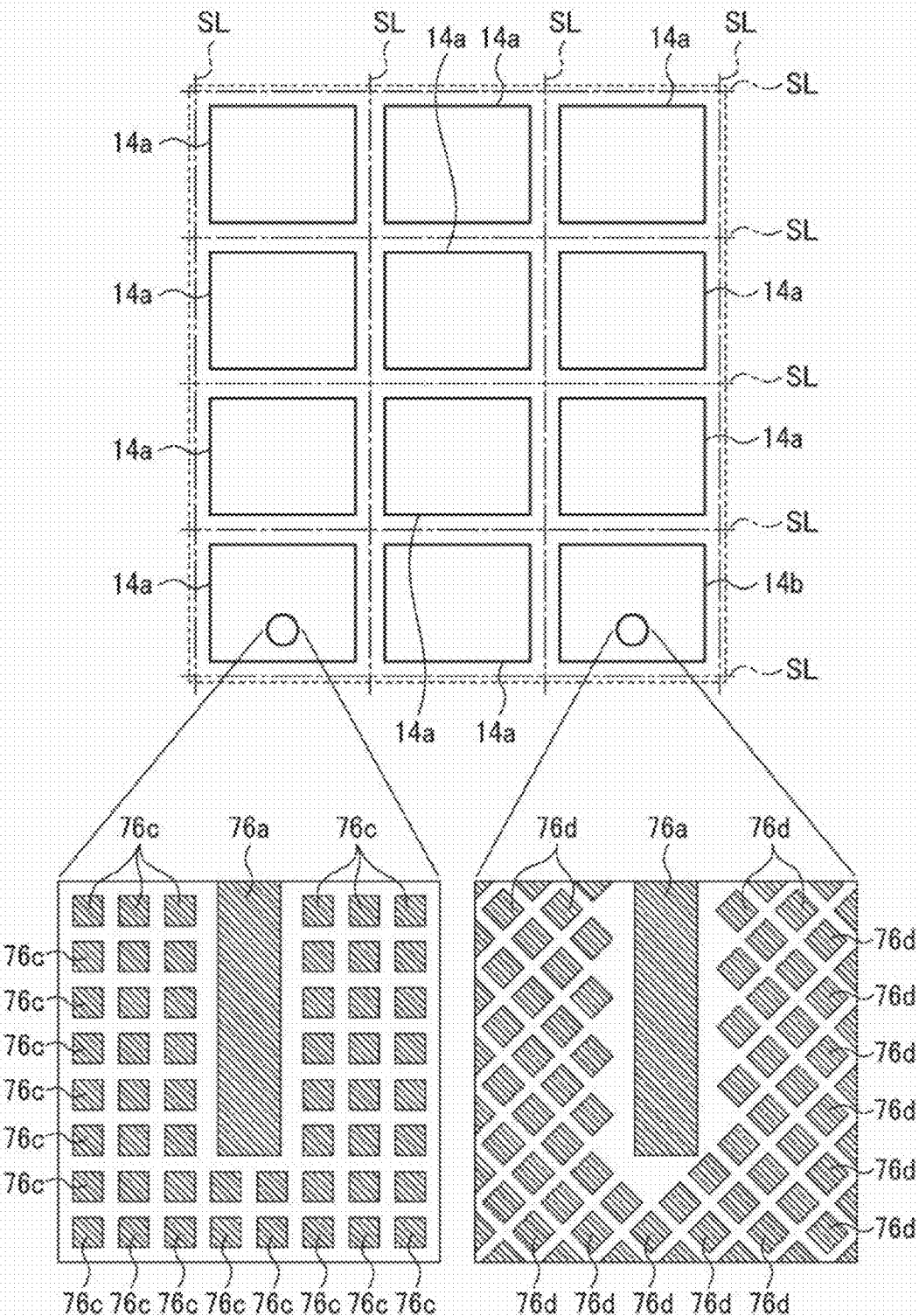
FIG. 2 is an enlarged partial view of FIG. 1.

FIG. 2 is an enlarged partial view of FIG. 1.

In FIG. 2, the shot region 12 is indicated by the broken line.

In the shot region 12, a plurality of chip regions (semiconductor chip regions, semiconductor chip-to-be-formed-regions, semiconductor chips) 14a, 14b are provided. For example, twelve chip regions 14a, 14b of four rows and three columns are provided here. The chip regions 14a are to be the ordinary semiconductor chips (ordinary chips). On the other hand, the chip region 14b may function as a semiconductor chip used as a mark (mark chip). One chip region (mark chip region, mark chip-to-be-formed-region, semiconductor chip, mark chip) 14b, for example, is provided in each shot region 12. The present embodiment will be described here by means of the example that one mark chip region 14b is provided in each shot region 12. The chip regions 14a other than the mark chip region 14b are ordinary chip regions (ordinary chip-to-be-formed-regions, ordinary chips). The size of the chip regions 14a, 14b is, e.g., about 1 mm×1 mm-5 mm×5 mm. The size of the chip regions 14a, 14b is, e.g., about 3 mm×3 mm here.

The respective chip regions 14a, 14b are defined by scribe lines (scribe line regions) SL. The scribe lines SL are indicated by the thin solid lines in FIG. 1 and indicated by the alternate long and short dash lines in FIG. 2.

After semiconductor chips have been formed in the respective chip regions 14a, 14b of the semiconductor wafer 10, dicing is made along the scribe lines SL, and the semiconductor chips 14a, 14b are diced into discrete chips.

The mark semiconductor chip 14b is usable not only as the mark but also as the ordinary product.

Figure 3:
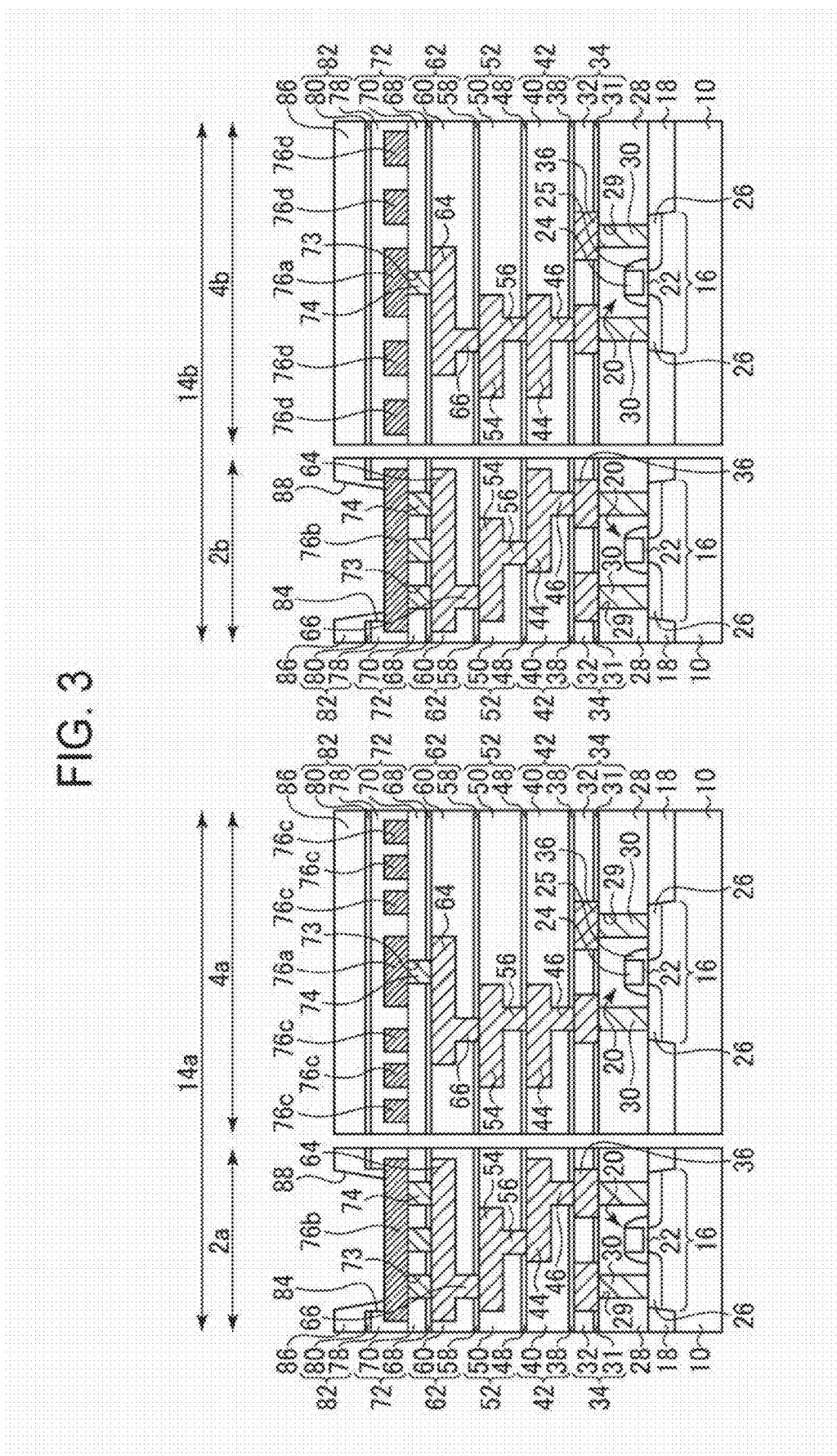
FIG. 3 is a sectional view of the semiconductor device according to a first embodiment.
Figure 5A:
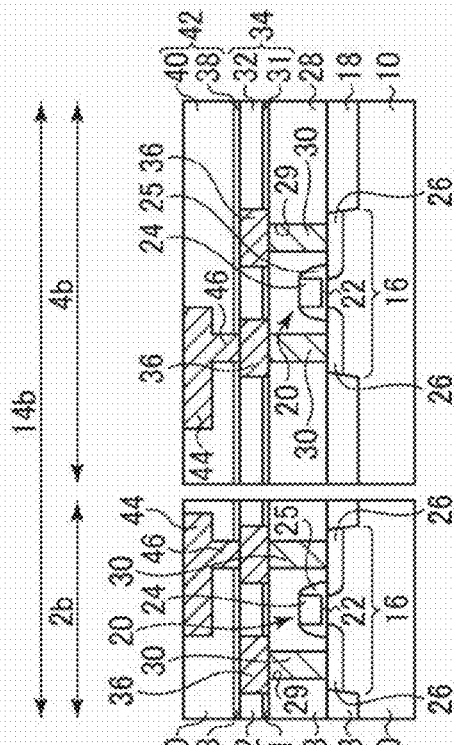
Figure 5B:
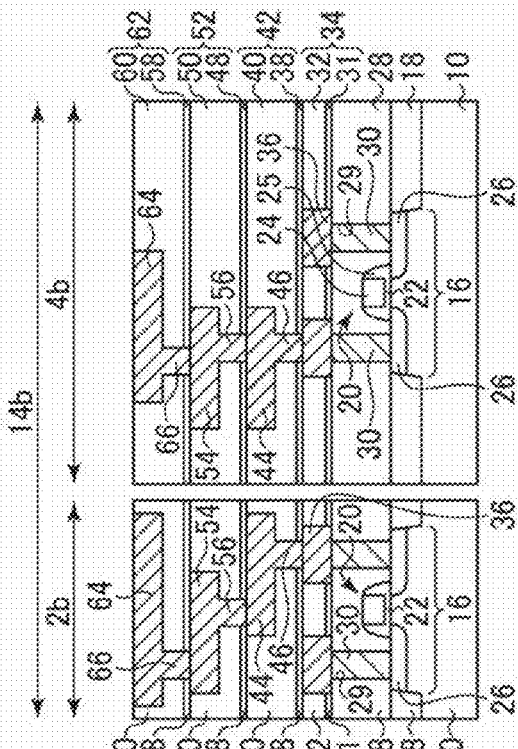
Figure 6:
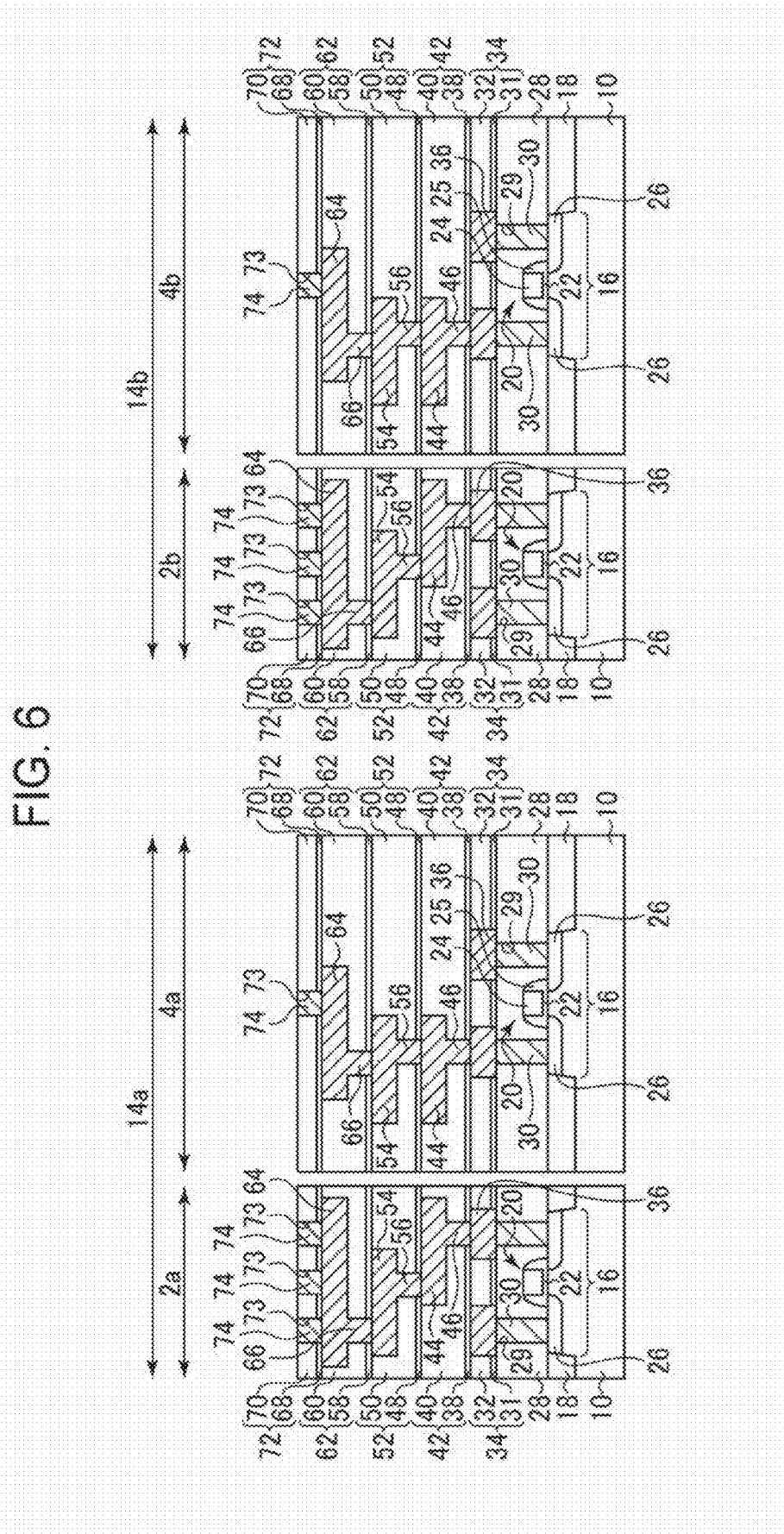

FIG. 3 is a sectional view of the semiconductor device according to the present embodiment. On the left side of the drawing of FIG. 3, the region 14a for the ordinary semiconductor chip to be formed in, i.e., a part of the ordinary chip region 14a is illustrated. On the right side of the drawing of FIG. 3, a part of the region 14b for the semiconductor chip used as a mark is formed in, i.e., a part of the mark chip region 14b is illustrated. On the left side of the drawing of the ordinary chip region 14a of FIG. 3, a region 2a for en electrode pad to be formed in is illustrated. On the right side of the drawing of the ordinary chip region 14a of FIG. 3, a region 4a for a device pattern to be formed in is illustrated. On the left side of the drawing of the mark chip region 14b of FIG. 3, a region 2b for an electrode pad to be formed in is illustrated. On the right side of the drawing of the mark chip region 14b of FIG. 3, a region 4b for a device pattern to be formed in is illustrated.

In the semiconductor wafer 10, device isolation regions 18 defining device regions 16 are formed.

In the device regions 16, transistors 20, etc. are formed. The transistors 20 each have a gate electrode formed on the semiconductor wafer 10 with a gate insulation film 22 formed therebetween, and source/drain layers 26 formed in the device region 16 on both sides of the gate electrode 24.

On the semiconductor wafer 10 with the transistors 20, etc. formed on, an inter-layer insulation film 28 of, e.g., silicon dioxide is formed. In the inter-layer insulation film 28, conductor plugs 30 connected to the source/drain diffused layers 26 are buried.

On the inter-layer insulation film 28, an insulation film (etching stopper film) of, e.g., SiC (SiOC) is formed. On the insulation film 31, an insulation film 32 of, e.g., silicon dioxide is formed. The insulation film 31 and the insulation film 32 form an inter-layer insulation film 34.

In the inter-layer insulation film 34, interconnections (first metal interconnection layers) 36 of, e.g., Cu are buried by, e.g., damascene. The dummy patterns (not illustrated) of Cu for CMP (Chemical Mechanical Polishing) are also buried in the inter-layer insulation film 34. The dummy patterns for the CMP are for attaining equalization of the polish rate in the wafer surface.

On the inter-layer insulation film 34, an insulation film (Cu diffusion preventing film) 38 of, e.g., SiC (SiOC) is formed. On the insulation film 38, an insulation film 40 of, e.g., silicon dioxide is formed. The insulation film 38 and the insulation film 40 form an inter-layer insulation film 42.

In the inter-layer insulation film 42, interconnection (second metal interconnection layers) 44 and conductor plugs 46 of, e.g., Cu are buried by, e.g., dual damascene. The conductor plugs 46 are connected to the interconnections 36. In the inter-layer insulation film 42, the dummy patterns (not illustrated) of Cu for CMP are also buried.

On the inter-layer insulation film 42, an insulation film (Cu diffusion preventing film) 48 of, e.g., SiC (SiOC) is formed. On the insulation film 48, an insulation film 50 of, e.g., silicon dioxide is formed. The insulation film 48 and the insulation film 50 form an inter-layer insulation film 52.

In the inter-layer insulation film 52, interconnections (the third metal interconnection layers) and conductor plugs 56 of, e.g., Cu are buried by, e.g., dual damascene. The conductor plugs 56 are connected to the interconnections 44. In the inter-layer insulation film 52, the dummy patterns (not illustrated) of Cu for CMP are also buried.

On the inter-layer insulation film 52, an insulation film (Cu diffusion preventing film) 58 of, e.g., SiC (SiOC) is formed. On the insulation film 58, an insulation film 60 of, e.g., silicon dioxide is formed. The insulation film 58 and the insulation film 60 form an inter-layer insulation film 62.

In the inter-layer insulation film 52, interconnections (fourth metal interconnection layers) 64 and conductor plugs 66 of, e.g., Cu are buried by, e.g., dual damascene. The conductor plugs 66 are connected to the interconnections 54. In the inter-layer insulation film 62, the dummy patterns (not illustrated) of Cu for CMP are also buried.

On the inter-layer insulation film 62, an insulation film (Cu diffusion preventing film) 68 of, e.g., SiC (SiOC) is formed. On the insulation film 68, an insulation film 70 of, e.g., silicon dioxide is formed. The insulation film 68 and the insulation film 70 form an inter-layer insulation film 72.

In the inter-layer insulation film 72, conductor plugs 74 of, e.g., tungsten are buried. The conductor plugs 74 are connected to the interconnections 64.

On the inter-layer insulation film 72, interconnections (device patterns, interconnection patterns) 76a are formed. The interconnections 76a is the uppermost metal interconnection layers of the interconnection layer (multi-layer interconnection structure) formed of the plural layers. On the inter-layer insulation film 72, electrode pads (bonding pads) 76b are also formed. The electrode pads 76b are for connection with the outside. To the electrode pads 76b, bonding wires (not illustrated), etc., for example, are connected. On the electrode pads 76b, solder bumps (not illustrated), etc. may be formed. On the inter-layer insulation film 72, dummy patterns 76c, 76d are also formed. The dummy patterns 76c are formed in the region 14a for the ordinary semiconductor chips formed in. The dummy patterns 76d are formed in the region 14b for the mark semiconductor chip formed in. The interconnections 76a, the electrode pads 76b and the dummy patterns 76c, 76d are formed by patterning one and the same conductor film. The material of the interconnections 76a, the electrode pads 76b and the dummy patterns 76c, 76d is, e.g., aluminum or others. The dummy patterns 76c, 76d serves to improve the uniformity of the etching rate in the wafer surface and prevent dimensional defects, falls, etc. of the device patterns 76a.

The view on the lower left of the drawing of FIG. 2 is the enlarged view of the circled part of the ordinary chip region 14a.

The view on the lower right of the drawing of FIG. 2 is the enlarged view of the circled part of the mark chip region 14b.

As seen in FIG. 2, the dummy patterns 76c formed in the ordinary chip region 14a and the dummy patterns 76d formed in the mark chip region 14b are different from each other in the configuration, in the manner of the arrangement, etc.

In the ordinary chip region 14a, a plurality of square dummy patterns 76c, for example, are arranged. Such dummy patterns 76c are arranged vertically and horizontally in the longitudinal direction of the scribe lines SL. The directions of the respective sides of the dummy patterns 76c in the ordinary chip region 14a are parallel with the longitudinal direction of the scribe lines SL. Since a plurality of dummy patterns 76 are arranged in such manner, a configuration (pattern) of the region (space region) where the dummy patterns 76c are absent generally in a mesh pattern. In other words, the pattern (pattern of the space) of the region where the dummy patterns 76c are absent is defined by the plural vertical patterns formed along the longitudinal direction of the scribe lines SL and the plural horizontal patterns, which are intersected with each other.

On the other hand, in the mark chip region 14b, for example, a plurality of rhomboidal dummy patterns 76d are arranged. In other words, the dummy patterns 76d have the configuration of the square of the dummy patterns 76c illustrated in FIG. 2, which is rotated by a prescribed rotation angle. The rotation angle is, e.g., 45 degrees here. Such dummy patterns 76d are arranged in directions oblique to the longitudinal directions of the scribe lines SL. The arrangement direction of the dummy pattern 76d is, e.g., 45 degrees to the longitudinal direction of the scribe line SL. The directions of the sides of the dummy patterns 76d in the mark chip region 14b are oblique to the longitudinal directions of the scribe lines SL. Since a plurality of such dummy pattern 76d are arranged in such manner, the configuration (pattern) of the region (space region) where the dummy patterns 76d are absent is an oblique meshed-shape as a whole. In other words, the pattern of the region where the dummy patterns 76d are absent is defined by a plurality of oblique patterns extended in the direction oblique to the longitudinal direction of the scribe lines SL, and a plurality of oblique patterns intersected with said oblique patterns.

As described above, the mark semiconductor chip 14b is used also as the ordinary product. Accordingly, the mark semiconductor chip 14b and the ordinary semiconductor chip 14a have the same structure in the constituent elements other than the dummy patterns 76c, 76d. Accordingly, the device pattern (interconnections, actual pattern, actual interconnection pattern) 76a of the mark chip 14a, and the device pattern 76a of the ordinary semiconductor chip 14a have the same configuration, dimensions, arrangements, etc.

The density of the dummy patterns 76c in the ordinary chip region 14a is set at a density which is suitable to pattern the device pattern 76a of the ordinary chip region 14a. The density of the dummy patterns is the occupation percentage of the area of the dummy patterns in the region where the dummy patterns are arranged. The density of the dummy patterns 65d in the mark chip region 14b is set at a density suitable to pattern the device patterns 76a of the mark chip region 14b. This is because unless the dummy patterns 76c, 76d are arranged in densities suitable to pattern the device patterns 76a, dimensional defects, falls, etc. of the device patterns 76a are often caused.

The device pattern 76a formed in the ordinary chip region 14a and the device pattern 76b formed in the mark chip region 14b have the same configuration, the same dimensions, the same arrangement, etc. Accordingly, it is preferable to set the density of the dummy patterns 76c in the ordinary chip region 14a and the density of the dummy patterns 76d in the mark chip 14b are equal to each other.

The density of the dummy patterns 76a in the ordinary chip region 14a is set at, e.g., about 44.4%. The density of the dummy patterns 76d in the mark chip region 14b is also set at, e.g., about 44.4%.

As described above, in the present embodiment, the manner of the arrangement of the dummy patterns 76c repeatedly arranged in the ordinary chip 14a and the manner of the arrangement of the dummy patterns 76d arranged repeatedly in the mark chip 14b are different from each other. In other words, the pattern generally defined by the dummy patterns 76c repeatedly arranged in the ordinary chip region 14a, the pattern generally defined by the dummy patterns 76d repeatedly arranged in the mark chip region 14b are different from each other. Further in other words, the pattern (interference fringe pattern) generally defined by the pattern groups of the dummy patterns 76c arranged in the ordinary chip region 14a, and the pattern generally defined by the pattern groups of the dummy patterns 76d arranged in the mark chip region 14b are different from each other. More further in other words, the pattern generally defined by the spaces between the dummy patterns 76c arranged in the ordinary chip region 14a, the pattern generally defined by the spaces between the dummy patterns 76d arranged in the mark chip region 14b are different from each other. Thus, according to the present embodiment, when the semiconductor chips 14a, 14b are observed, the appearance of the ordinary chips 14a and the appearance of the mark chips 14b look different from each other. Specifically, at a certain angle, the luminance of the ordinary chips 14a and the luminance of the mark chips 14b are different from each other. The pattern (interference fringe pattern) generally formed by the dummy patterns 76c repeatedly arranged in the ordinary chip 14a, and the pattern (interference fringe pattern) generally formed by the dummy patterns 76d repeatedly arranged in the mark chip 14b look different from each other. Thus, according to the present embodiment, the ordinary chip 14a and the mark chip 14b can be easily distinguished from each other by the appearance observation. Thus, according to the present embodiment, the semiconductor chip 14b used as a mark can be easily identified.

On the inter-layer insulation film 72 with the interconnections 76a, the electrode pads 76b and the dummy patterns 76b formed on, a silicon oxide film 78 and a silicon nitride film 80 are formed. The silicon oxide film 78 and the silicon nitride film 80 form a protection film 82. In the protection film 82, openings 84 are formed down to the electrode pads 76b.

On the protection film 82, a protection film 86 of, e.g., polyimide is formed. In the protection film 86, openings 88 are formed down to the electrode pads 76b.

Thus, the semiconductor wafer 10 according to the present embodiment is formed.

As described above, according to the present embodiment, the manner of the arrangement of the dummy patterns 76c repeatedly arranged in the ordinary chip 14a, and the manner of the arrangement of the dummy patterns 76d repeatedly arranged in the mark chip 14b are different from each other. Thus, according to the present embodiment, the ordinary chip 14a and the mark chip 14b can be easily distinguished from each other by the appearance observation. Furthermore, the other constituent elements other than the dummy patterns 76c, 76d are not different between the ordinary chip 14a and the mark chip 14b. Thus, not only the ordinary chip 14a but also the mark chip 14b can be used as the product. Furthermore, the mark chip 14b never affects the ordinary chip 14a adjacent to the mark chip 14b. Thus, according to the present embodiment, the semiconductor chip (semiconductor device) can be provided with high yields, which contributes to the cost reduction of the semiconductor device.

(Method for Manufacturing a Semiconductor Device)

Next, a method for manufacturing a semiconductor device will be described with reference to FIGS. 4 to 14. FIGS. 4 to 8 and FIGS. 10 to 14 are sectional views of the semiconductor device in the steps of the method for manufacturing the semiconductor device according to the present embodiment, which illustrate the method.

First, the device isolation regions 18 defining the device regions 16 are formed in the semiconductor wafer 10 by, e.g., STI (Shallow Trench Isolation).

Next, a gate insulation film 22 of silicon dioxide of, e.g., an about 9 nm-film thickness is formed on the entire surface by, e.g., thermal oxidation.

Next, a polysilicon film of, e.g., an about 120 nm-film thickness is formed on the entire surface by, e.g., CVD (Chemical Vapor Deposition).

Next, by photolithography, the polysilicon film is patterned to form the gate electrodes 24 of polysilicon.

Then, a dopant impurity is implanted into the device regions 16 by, e.g., ion implantation with the gate electrodes 24 as a mask to form lightly doped diffused regions (not illustrated).

Next, a silicon dioxide film or a silicon nitride film, of, e.g., about 150 nm-film thickness is formed on the entire surface by, e.g., CVD.

Then, the insulation film is anisotropically etched to form a sidewall insulation film 25 on the side walls of the gate electrodes 24.

Next, a dopant impurity is implanted into the device regions 16 by, e.g., ion implantation with the gate electrodes 24 with the sidewall insulation film 25 formed on as a mask to form highly doped regions (not illustrated). The lightly doped diffused regions and the highly doped diffused regions form the source/drain diffused layers 26 of the extension source/drain structure (see FIG. 4A).

Then, the inter-layer insulation film 28 of silicon dioxide of, e.g., an about 1 μm-film thickness is formed on the entire surface by, e.g., CVD.

Next, by photolithography, the contact holes 29 are formed down to the source/drain regions 26 of the transistors 20.

Next, a barrier metal (not illustrated) of, e.g. TiN is formed on the entire surface by, e.g., sputtering.

Then, a conduction film of, e.g., tungsten is formed on the entire surface by, e.g., CVD.

Then, the conduction film and the barrier metal are polished by, e.g., CMP until the surface of the inter-layer insulation film 28 is exposed. Thus, the conductor plugs 30 of tungsten are buried in the contact holes 29 (see FIG. 4B).

Next, the insulation film (etching stopper film) 31 of SiC (SiOC) of, e.g., an about 100 nm-film thickness is formed on the entire surface by, e.g., plasma enhanced CVD.

Next, the insulation film 32 of silicon dioxide of, e.g., an about 1.2 μm-film thickness is formed on the entire surface by, e.g., plasma enhanced CVD. The insulation film 31 and the insulation film 32 form the inter-layer insulation film 34.

Then, the interconnections (the first metal interconnection layers) 36 of, e.g., Cu are buried in the inter-layer insulation film 34 by, e.g., damascene. That is, first, the trenches for the interconnections 36 to be buried in are formed in the inter-layer insulation film by photolithography. Next, a barrier metal (not illustrated) of, e.g., TiN is formed by, e.g., sputtering. Next, a seed layer (not illustrated) of Cu is formed by, e.g., sputtering. Then, a Cu film is formed by, e.g., electroplating. Next, the Cu film, the seed layer and the barrier metal are polished by, e.g., CMP until the surface of the inter-layer insulation film 34 is exposed. Thus, the interconnections (the first metal interconnection layers) 36 of Cu are buried in the inter-layer insulation film 34 by damascene. The dummy patterns (not illustrated) of Cu for CMP are also buried in the inter-layer insulation film 34 (see FIG. 4C).

Next, the insulation film (Cu diffusion preventing film) 38 of SiC (SiOC) of, e.g., an about 100 nm-film thickness is formed on the entire surface by, e.g., plasma enhanced CVD.

Next, the insulation film 40 of silicon dioxide of, e.g. an about 1.2 μm is formed on the entire surface by, e.g., plasma enhanced CVD. The insulation film 38 and the insulation film 40 form the inter-layer insulation film 42.

Next, the interconnections (the second metal interconnection layers) 44 of Cu and the conductor plugs 46 are buried in the inter-layer insulation film 42 by, e.g., dual damascene. That is, the trenches for the interconnections 44 to be buried in and the contact holes for the conductor plugs 46 to be buried in are formed in the inter-layer insulation film 42 by photolithography. Next, a barrier metal (not illustrated) of, e.g., Ti, TiN or others is formed by, e.g., sputtering. Next, a seed layer (not illustrated) of Cu is formed by, e.g., sputtering. Next, a Cu film is formed by, e.g., electroplating. Then, the Cu film, the seed layer and the barrier metal are polished by, e.g., CMP until the surface of the inter-layer insulation film 42 is exposed. Thus, the interconnections (the second metal interconnection layers) 44 and the conductor plugs 46 of Cu are buried in the inter-layer insulation film 42 by dual damascene. The conductor plugs 46 are connected to the interconnections 36 (see FIG. 5A). In the inter-layer insulation film 42, the dummy patterns (not illustrated) of Cu for CMP are also buried.

Next, the insulation film (Cu diffusion preventing film) 48 of SiC (SiOC) of, e.g., an about 100 nm-film thickness is formed on the entire surface by, e.g., plasma enhanced CVD.

Next, the insulation film 50 of silicon dioxide of, e.g., an about 1.2 μm film thickness is formed on the entire surface by, e.g., plasma enhanced CVD. The insulation film 48 and the insulation film 50 form the inter-layer insulation film 52.

Then, the interconnections (the third metal interconnection layers) 54 and the conductor plugs 56 of Cu are buried in the inter-layers insulation film 52 by, e.g., dual damascene. The method for burying the interconnections 54 and the conductor plugs 56 in the inter-layer insulation film 52 is the same as the above-described method for burying the interconnections 44 and the conductor plugs 46 in the inter-layer insulation film 42. The conductor plugs 56 are connected to the interconnections 44. In the inter-layer insulation film 52, the dummy patterns (not illustrated) of Cu for CMP are also buried.

Next, the insulation film (Cu diffusion preventing film) 58 of SiC (SiOC) of, e.g., an about 100 nm-film thickness is formed on the entire surface by, e.g., plasma enhanced CVD.

Next, the insulation film 60 of silicon dioxide of, e.g. an about 1.2 μm film thickness is formed on the entire surface by, e.g., plasma enhanced CVD. The insulation film 58 ad the insulation film 60 form the inter-layer insulation film 62.

Then, the interconnections (the fourth metal interconnection layers) 64 and the conductor plugs 66 of Cu are buried in the inter-layer insulation film 62 by, e.g., dual damascene. The method for burying the interconnections 64 and the conductor plugs 66 in the inter-layer insulation film 62 is the same as the above-described method for burying the interconnections 44 and the conductor plugs 46 in the inter-layer insulation film 42. The conductor plugs 66 are connected to the interconnections 54 (see FIG. 5B). In the inter-layer insulation film 62, the dummy patterns (not illustrated) of Cu for CMP are also buried.

Next, the insulation film (Cu diffusion preventing film) 68 of SiC (SiOC) of, e.g., an about 100 nm-film thickness is formed by, e.g., plasma enhanced CVD.

Then, the insulation film 70 of silicon dioxide of, e.g., an about 1.2 µm-film thickness is formed by, e.g., plasma enhanced CVD. The insulation film 68 and the insulation film 70 form the inter-layer insulation film 72.

Next, the contact holes 73 are formed in the inter-layer insulation film 72 down to the interconnections 64 by photolithography.

Next, a barrier metal (not illustrated) of, e.g., Ti, TiN or others is formed on the entire surface by, e.g., sputtering.

Then, the conduction film of, e.g., tungsten is formed on the entire surface by, e.g., CVD.

Next, the conduction film and the barrier metal are polished by, e.g., CMP until the surface of the inter-layer insulation film 72 is exposed. Thus, the conductor plugs 74 of tungsten are buried in the contact holes 73 (see FIG. 6).

Figure 7:
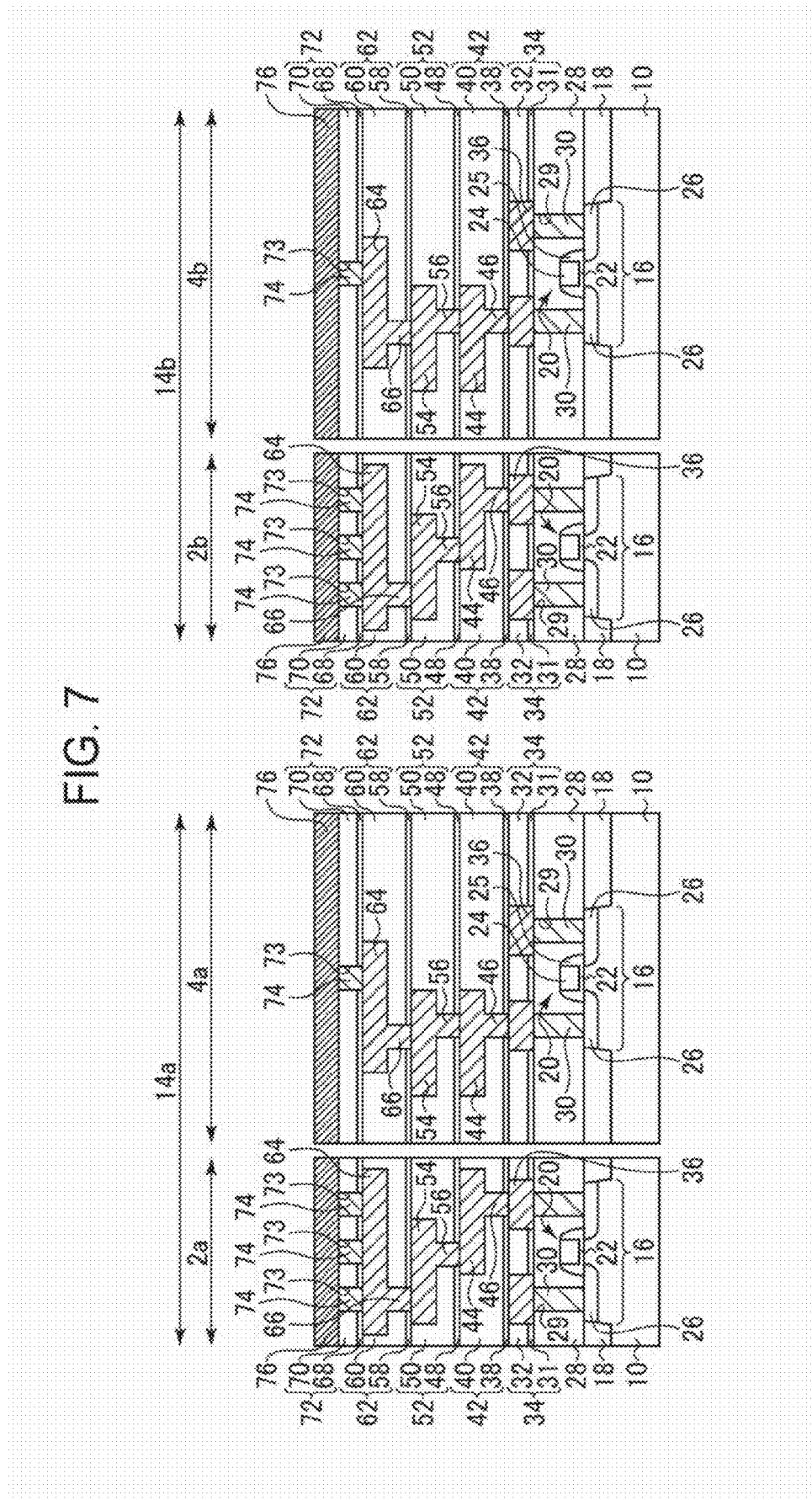

Next, as illustrated in FIG. 7, the conduction film 76 of aluminum of, e.g., an about 300 nm-film thickness is formed on the entire surface by, e.g., sputtering.

Figure 8:
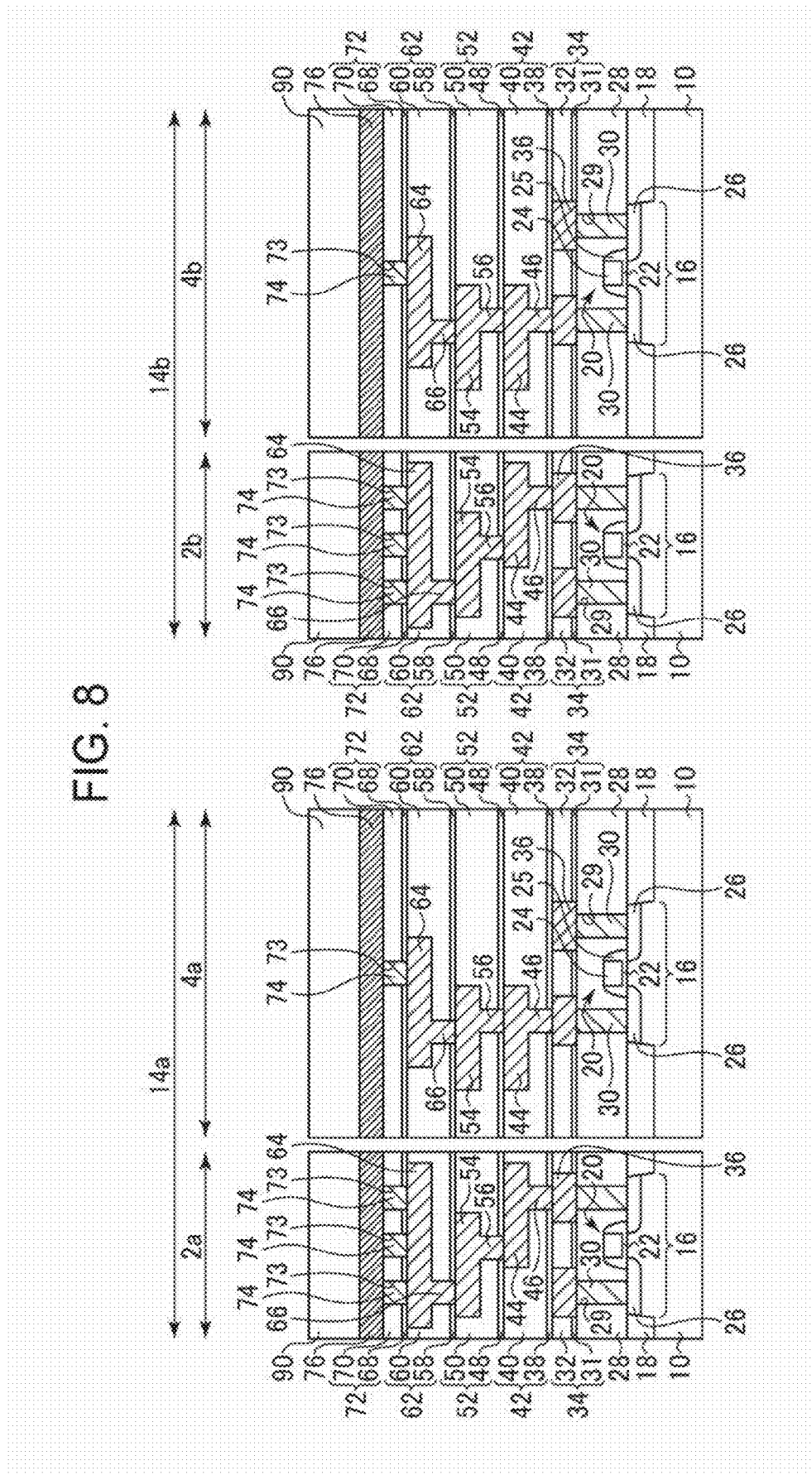

Then, as illustrated in FIG. 8, a photoresist film 90 is formed on the entire surface by, e.g., spin coating.

Figure 9:
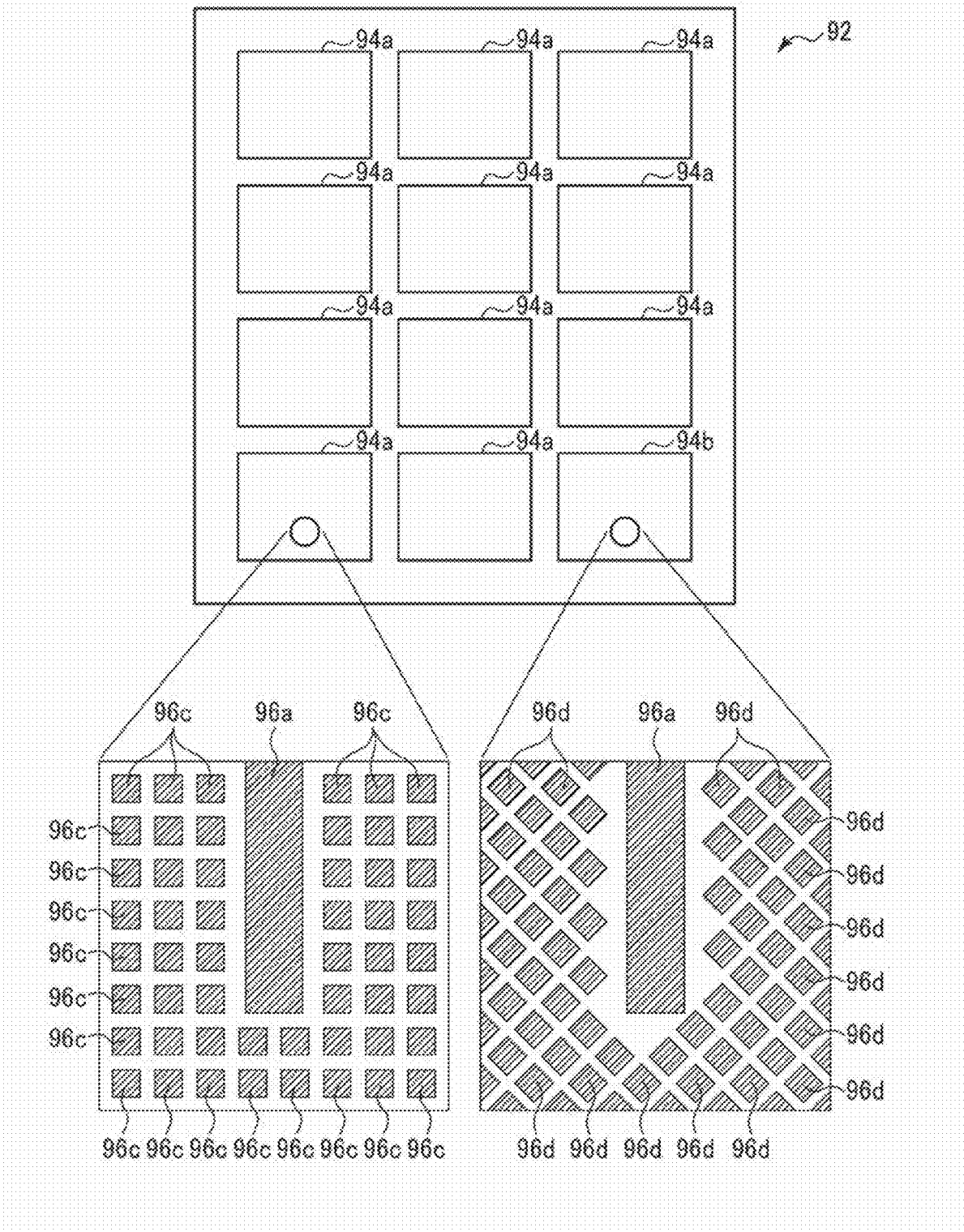
FIG. 9 is a plan view of a reticle used in the method for manufacturing the semiconductor device according to the first embodiment.
Figure 10:
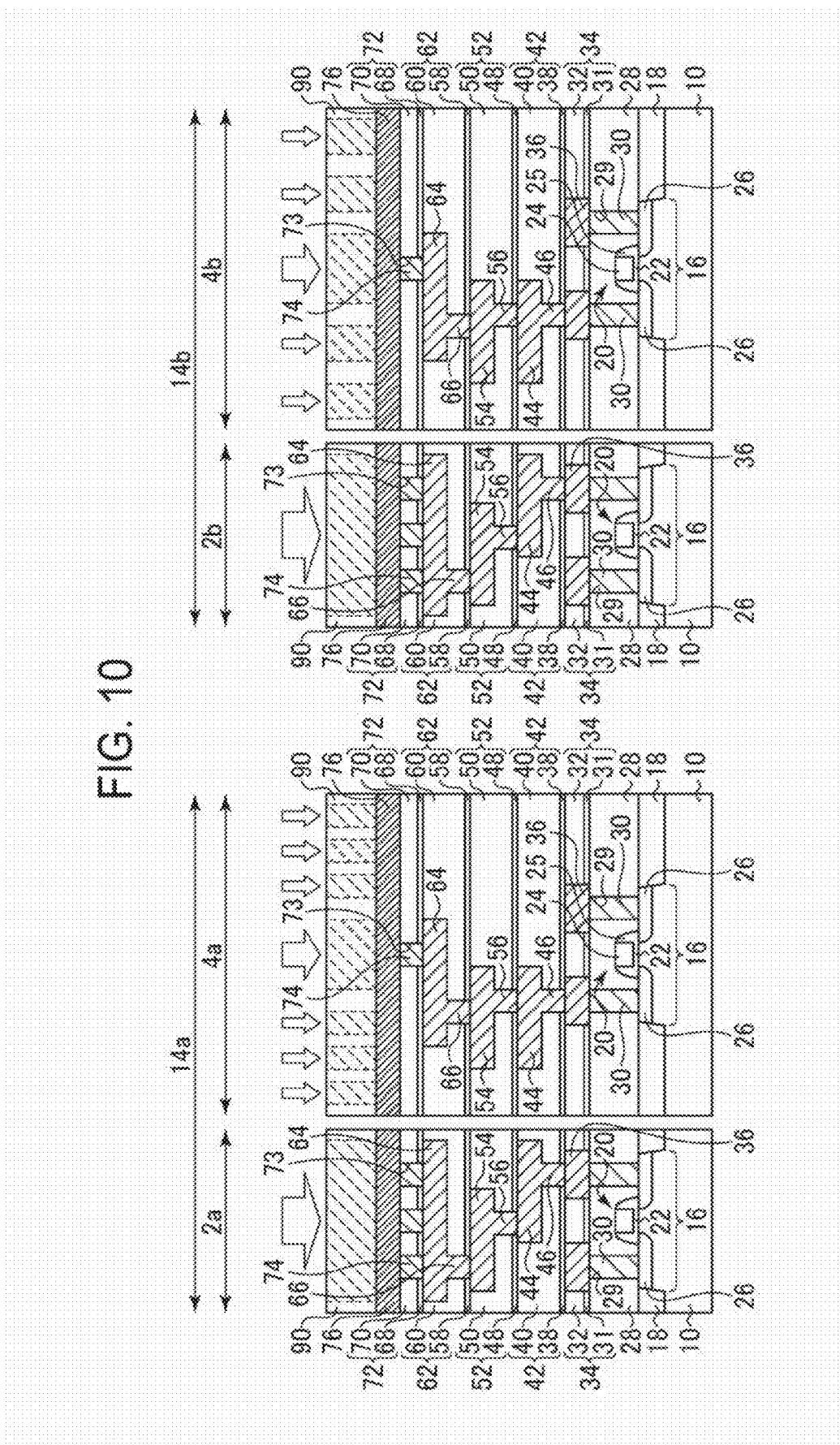

Then, the photoresist film 90 is exposed with the use of the reticle 92 illustrated in FIG. 9 (see FIG. 10).

FIG. 9 is a plan view of the reticle used in the method for manufacturing the semiconductor device according to the present embodiment.

As illustrated in FIG. 9, pattern regions 94a for the ordinary chips and a pattern region 94b for the mark chip are formed in the reticle 92. The pattern regions 94a for the ordinary chips are for transferring the patterns onto the ordinary chip regions 14a of the semiconductor wafer 10. The pattern 94b for the mark chip is for transferring the pattern onto the mark chip region 14b of the semiconductor wafer 10.

The view on the lower left of the drawing of FIG. 9 is the enlarged view of the circled part of the pattern region 94a for the ordinary chip.

The view on the lower right of the drawing FIG. 9 is the enlarged view of the circled part of the pattern region 94b for the mark chip.

The device pattern 96a, the dummy patterns 96c, etc. formed in the pattern region 94a for the ordinary chip are formed, corresponding to the device pattern 76a, the dummy patterns 76d formed in the ordinary chip region 14a of the semiconductor wafer 10.

The device pattern 96a, the dummy patterns 96d, etc. formed in the pattern region 94b for the mark chip are formed, corresponding to the device pattern 76a and the dummy patterns 76d formed in the mark chip region 14b of the semiconductor wafer 10.

By using such reticle 92, the exposure of the patterns is made to the photoresist film 90. The exposure of the pattern using the reticle 92 is made sequentially to the shot regions 12 illustrated in FIG. 1.

Thus, the exposure using the reticle 92 is made all the shot regions 12.

Figure 11:
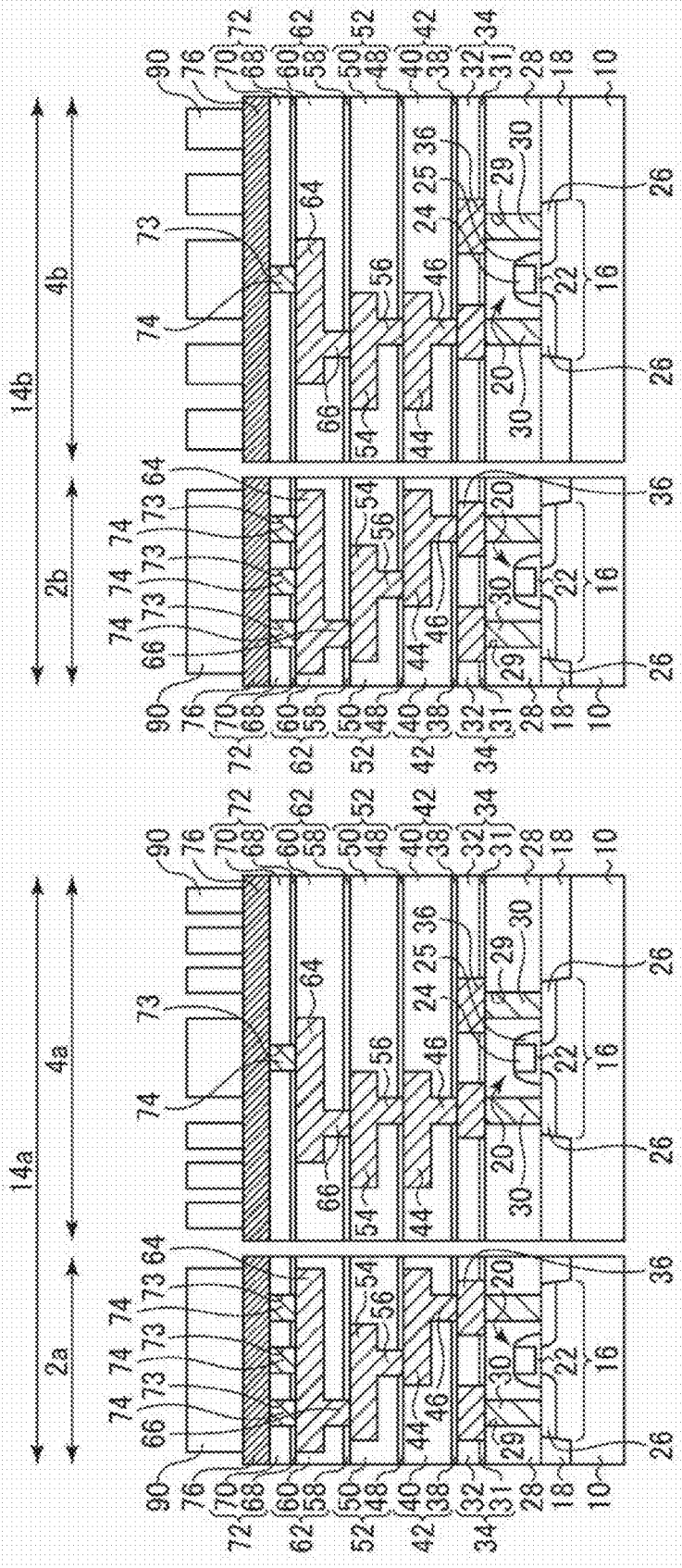
Figure 12:
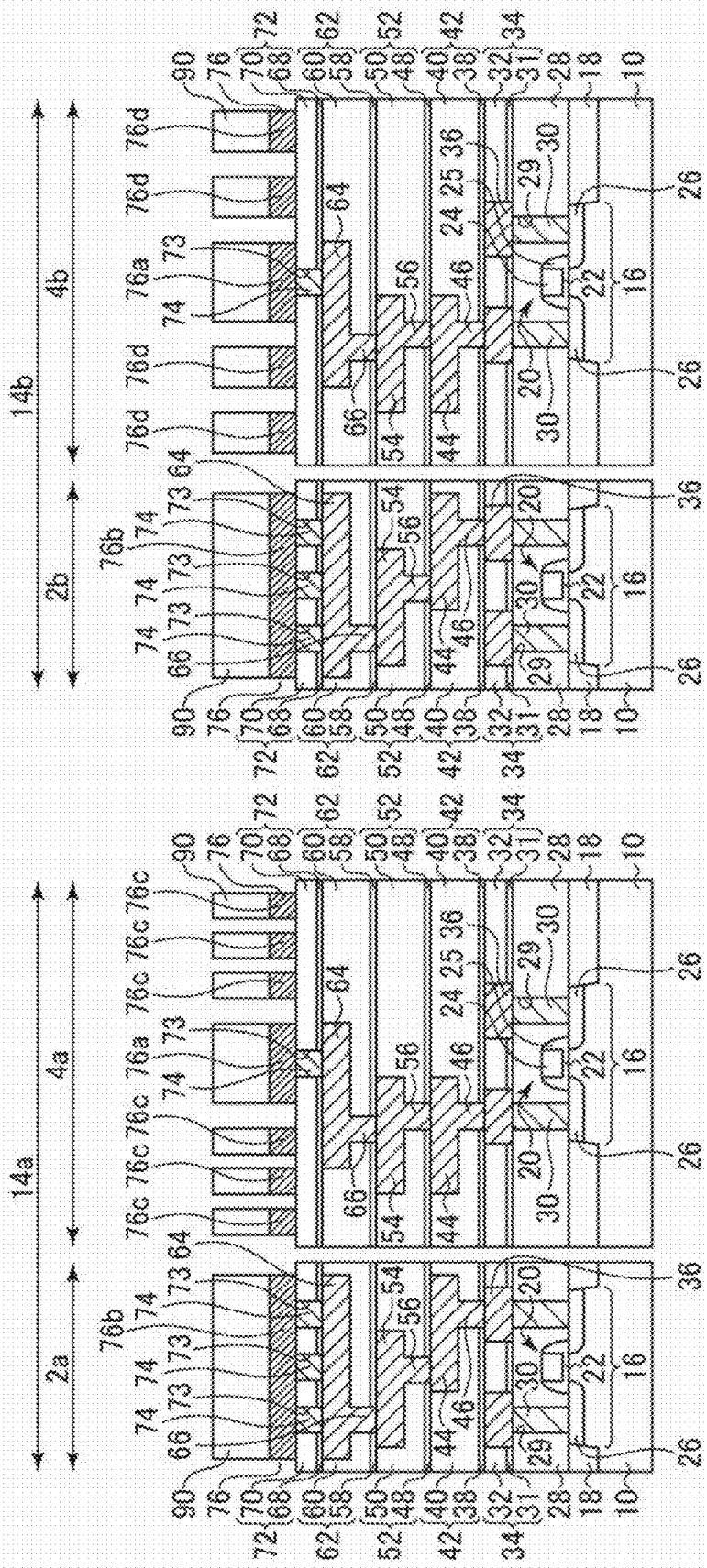

Then, the exposed photoresist film 90 is developed (see FIG. 11). Thus, the photoresist film 90 is patterned into plane configuration of the device pattern 76a. The photoresist film 90 is patterned into the plane configuration of the device pattern 76b. The photoresist film 90 is patterned into the plane configurations of the dummy patterns 76c, 76d.

Then, with the photoresist film 90 as the mask, the conduction film 76 is etched. Thus, device patterns 76a, the electrode pads 76b and the dummy patterns 76c, 76d are formed (see FIG. 12).

The density (occupation percentage) of the dummy patterns 76c in the ordinary chip region 14a is a density suitable to pattern the device pattern 76a of the ordinary chip region 14a. The density of the dummy patterns 65d in the mark chip region 14b is a density suitable to pattern the device pattern 76a of the mark chip region 14b. Thus, the device patterns 76a are formed with the dummy patterns 76c, 76d formed in suitable densities, whereby dimensional defects, falls, etc. of the device patterns 76a can be prevented.

Figure 13:
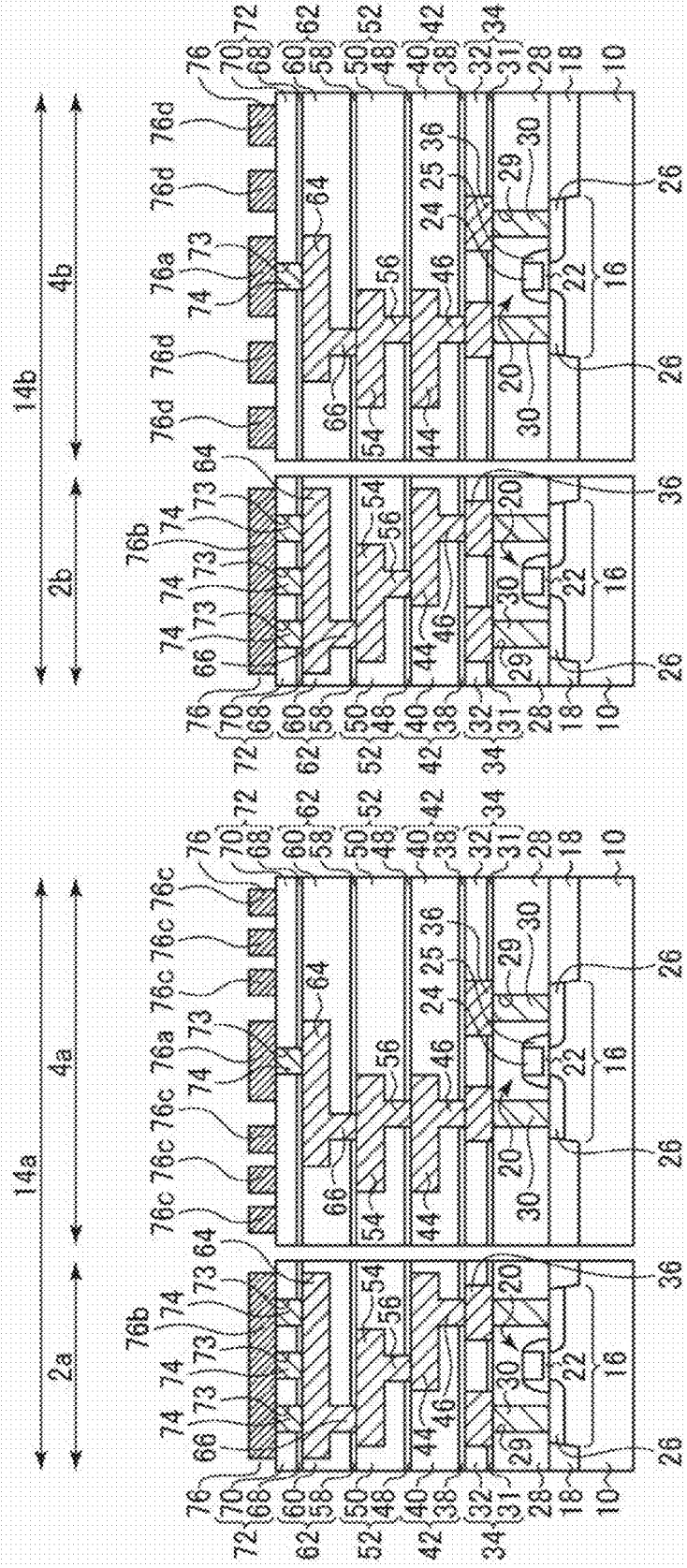
Figure 14:
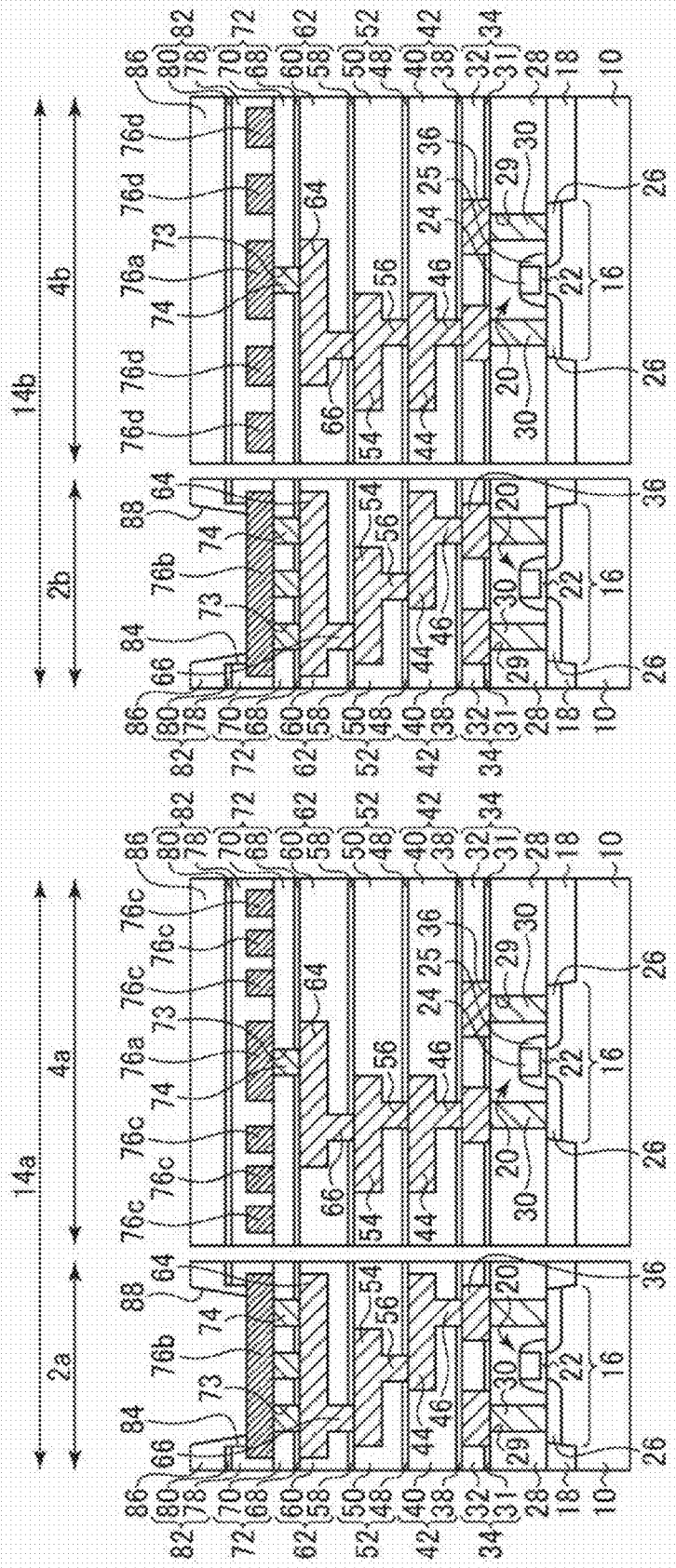

Next, the photoresist film 90 is released by, e.g., asking (see FIG. 13).

The silicon oxide film 78 of, e.g., an about 200-300 nm-film thickness is formed on the entire surface by, e.g., CVD.

Next, the silicon nitride film 80 of, e.g., an about 500 nm-film thickness is formed on the entire surface by, e.g., CVD. The silicon oxide film 78 and the silicon nitride film 80 form the protection film 82.

Next, the openings 84 are formed in the protection film 82 down to the electrode pads 76b by photolithography.

Then, a protection film 86 of, e.g., photosensitive polyimide is formed on the entire surface by, e.g., spin coating.

Next, openings 88 are formed in the protection film 86 down to the electrode pads 76b by photolithography.

As described above, the semiconductor wafer according to the present embodiment is manufactured. That is, the semiconductor wafer 10 can include the semiconductor chips (semiconductor devices) which are ordinary formed in the ordinary chip regions 14a, and the semiconductor chip (semiconductor device) which can be the mark formed in the mark chip region 14b (see FIG. 14).

The thus manufactured semiconductor wafer 10 is tested as follows.

First, the semiconductor wafer 10 is placed on a mount (not illustrated) of a test apparatus.

Next, the semiconductor chip 14b to be the mark is identified with a camera for the chip position recognition (not illustrated) of the test apparatus. For example, the mark chip 14b positioned in a first shot region 12 can be made as the mark. As described above, the ordinary chip 14a and the mark chip 14b can be distinguished from each other easily by observing the outer appearances, which makes it easy to identify the mark chip 14b.

Then, the semiconductor chips 14a, 14b to be first tested are decided with the mark chip 14b as the mark.

Then, the test is made sequentially on a plurality of the semiconductor chips 14a, 14b formed on the semiconductor wafer 10. The test results are stored in the memory unit (not illustrated) of the test apparatus, associated with the serial numbers allotted to the respective semiconductor chips 14a, 14b.

Thus, the test is completed on the plural semiconductor chips 14a, 14b formed on the semiconductor wafer 10.

After the test has been completed, the semiconductor chips 14a, 14b will be diced into discrete chips.

First, the semiconductor wafer 10 is mounted on a sheet not illustrated. The sheet is, e.g., a thermal releasable sheet or others.

Next, the dicing is made along the scribe lines SL with a dicer. Thus, the semiconductor chips 14a, 14b are made discrete, and the plural semiconductor chips (semiconductor devices) are obtained.

Then, the position of the semiconductor chip 14b used as the mark is identified with a chip position identifying camera (not illustrated). As described above, the ordinary chip 14a and the mark chip 14b can be easily distinguished from each other by the observation of the outer appearances, which makes it easy to identify the position of the semiconductor chip 14b decided as the mark.

Next, based on the position of the mark semiconductor chip 14b used as the mask, the positions of the semiconductor chips 14a, 14b the first test has been made on are identified.

Then, the discrete semiconductor chips 14a, 14b are picked up in the sequence of the serial numbers allotted in advance and sequentially transferred. The semiconductor chips 14a, 14b can be picked up with, e.g., chip adsorption tool (not illustrated) or others.

The serial numbers of the semiconductor chips 14a, 14b and the test results are associated with each other, whereby defective semiconductor chips 14a, 14b can be excluded, and the semiconductor chips 14a, 14b which have passed the test can be used as the products.

(A First Modification)

Figure 15:
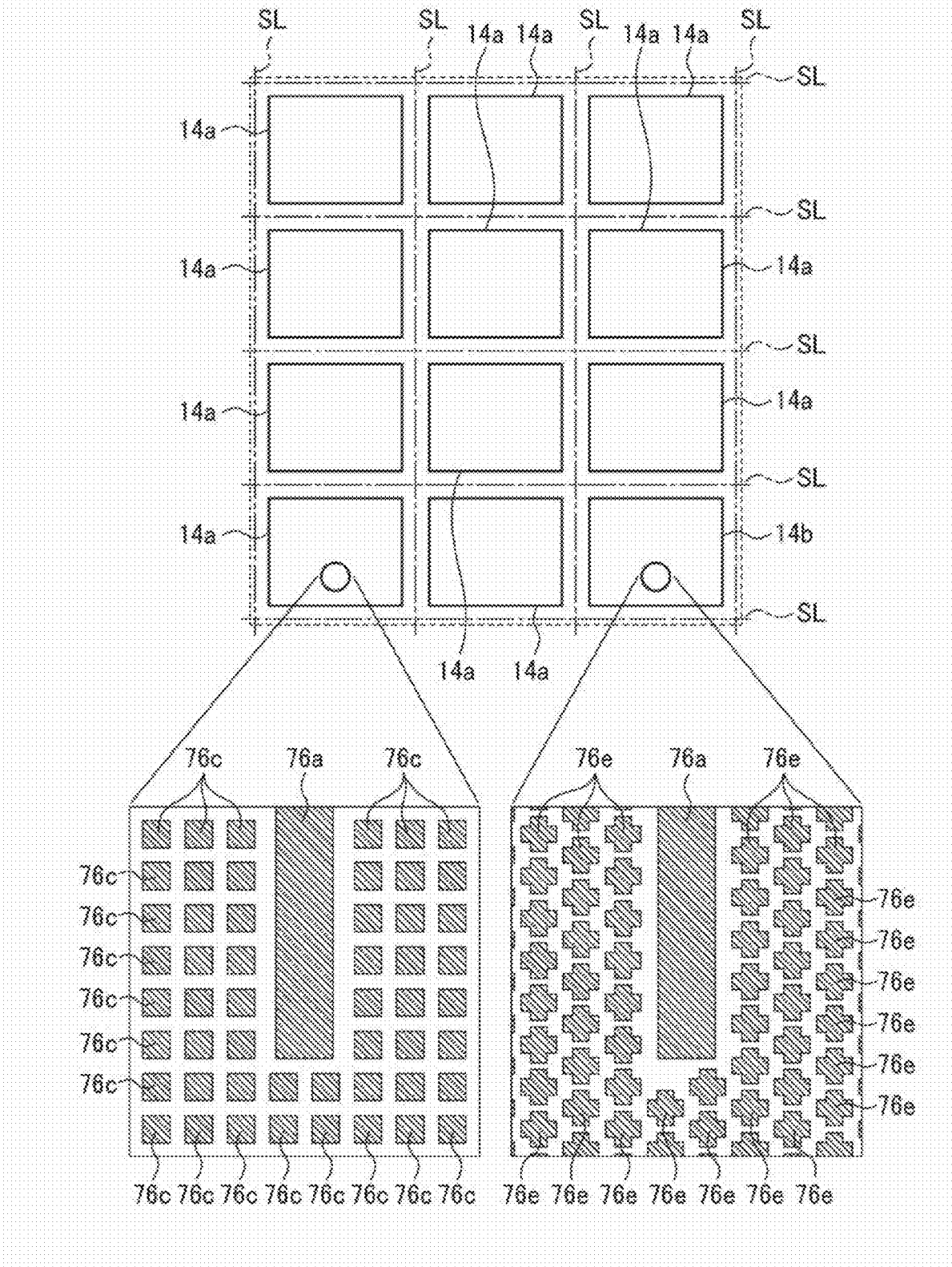
FIG. 15 is an enlarged plan view of a part of a semiconductor wafer according to a first modification.

Next, the semiconductor wafer according to a first modification of the present embodiment will be described with reference to FIG. 15. FIG. 15 is the enlarged plan view of a part of the semiconductor wafer according to the present modification.

As illustrated in FIG. 15, in the present modification, the plane configuration of dummy patterns 76e repeatedly arranged in the mark chip 14b is, e.g., a cross-shaped. These dummy patterns 76e are arranged in the longitudinal directions of the scribe lines SL, gradually offset obliquely from each other.

In the ordinary chip 14a, as in the ordinary chip 14a of the semiconductor wafer 10 described above with reference to FIGS. 1 to 3, the dummy patterns 76c of, e.g., a square are arranged vertically and horizontally.

The density of the dummy patterns 76c in the ordinary chip 14a is set at, e.g., about 44.4%. The density of the dummy patterns 76e in the mark chip 14b is set at, e.g., about 43.5%. That is, the density of the dummy patterns 76c in the ordinary chip 14a and the density of the dummy patterns 76e in the mark chip 14b are equal to each other.

As described above, the plane configuration of the dummy patterns 76e used in the mark chip 14b may be, e.g., cross-shaped.

In the present modification as well, the configuration and the manner of the arrangement of the dummy patterns 76c in the ordinary chip 14a and the configuration and the manner of the arrangement of the dummy patterns 76e in the mark chip 14b are different from each other. Accordingly, in the present modification as well, the ordinary chips 14a and the mark chip 14b can be distinguished easily from each other by the observation of the outer appearances.

(A Second Modification)

Figure 16:
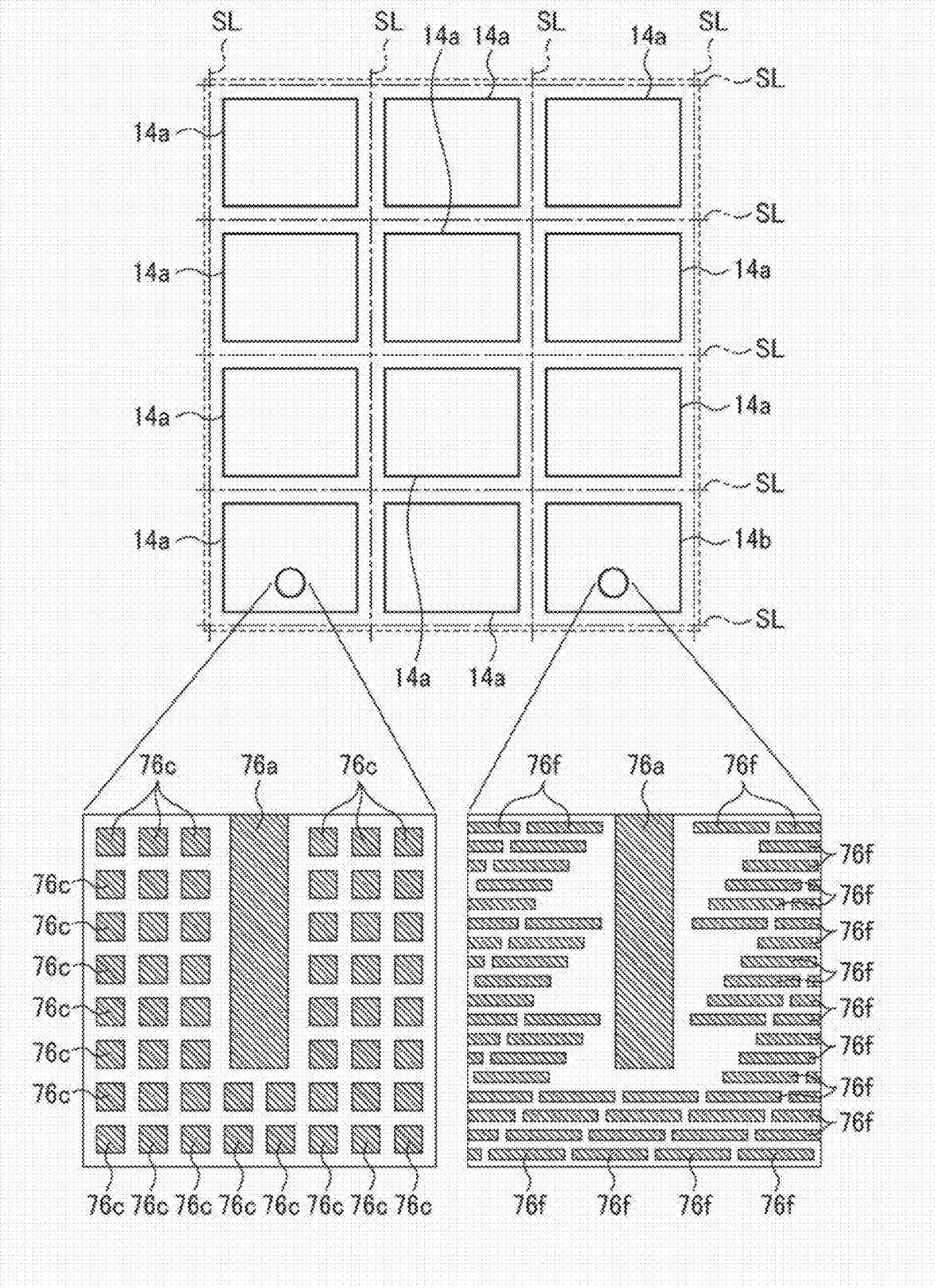
FIG. 16 is the enlarged plan view of a part of a semiconductor wafer according to a second modification.

Next, the semiconductor wafer according to a second modification of the present embodiment will be described with reference to FIG. 16. FIG. 16 is the enlarged plan view of a part of the semiconductor wafer according to the present modification.

As illustrated in FIG. 16, in the present modification, the plane configuration of dummy patterns 76f repeatedly arranged in the mark chip 14b is, e.g., a rectangle. The longitudinal directions of the dummy patterns 76f are, e.g., left-to-right as viewed in FIG. 16. The dummy patterns 76f are arranged, gradually offset obliquely to the longitudinal directions of the scribe lines SL.

In the ordinary chip 14a, the dummy patterns 76c of, e.g., a square are arranged vertically and horizontally as well as in the ordinary chip 14a of the semiconductor wafer 10 described above with reference to FIGS. 1 to 3.

The density of the dummy patterns 76c in the ordinary chip 14a is set at, e.g., about 44.4%. The density of the dummy patterns 76f in the mark chip 14b is set at, e.g., about 45.5%. That is, the density of the dummy patterns 76c in the ordinary chip 14a and the density of the dummy patterns 76f in the mark chip 14b are equal to each other.

As described above, the dummy patterns 76f used in the mark chip 14b may be, e.g., a rectangle.

In the present modification as well, the configuration and the manner of the arrangement of the dummy patterns 76c in the ordinary chip 14a and the configuration and the manner of the arrangement of the dummy patterns 76f in the mark chip 14b are different from each other. Accordingly, in the present modification as well, the ordinary chips 14a and the mark chip 14b can be distinguished easily from each other by the observation of the outer appearances.

(A Third Modification)

Figure 17:
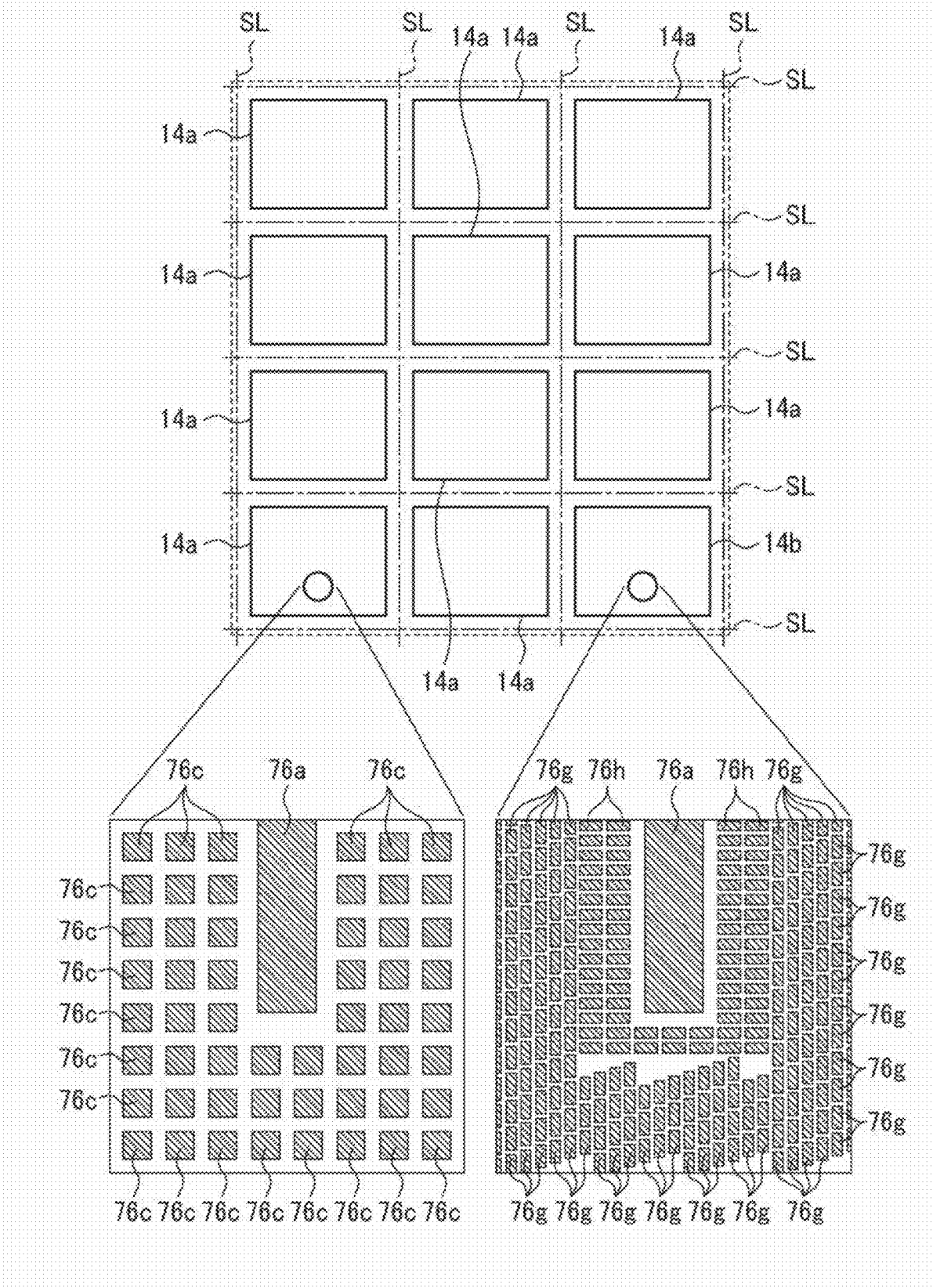
FIG. 17 is the enlarged plan view of a part of a semiconductor wafer according to a third modification.

Next, the semiconductor wafer according to a third modification of the present embodiment will be described with reference to FIG. 17. FIG. 17 is the enlarged plan view of a part of the semiconductor wafer according to the present modification.

As illustrated in FIG. 17, in the present modification, the plane configuration of dummy patterns 76g repeatedly arranged in the mark chip 14b is, e.g., a rectangle. The longitudinal directions of the dummy patterns 76g are, e.g., up-to-down as viewed in FIG. 17. The dummy patterns 76g are arranged, gradually offset obliquely to the longitudinal directions of the scribe lines SL.

In the present modification, the dummy pattern arranged region (dummy pattern inserted region) where the dummy patterns 76g are arranged is surrounded and bordered by dummy patterns 76h. The plane configuration of the dummy pattern 76h is, e.g., a rectangle. The longitudinal directions of the dummy patterns 76h is, e.g., left-to-right as viewed in FIG. 17.

In the ordinary chip 14a, the dummy patterns 76c of, e.g., a square are vertically and horizontally as well in the ordinary chip 14a of the semiconductor wafer 10 described above with reference to FIGS. 1 to 3.

As described above, the dummy pattern arranged region where the dummy patterns 76g are arranged may be surrounded and bordered by the dummy patterns 76h. Such bordering often makes it easier to distinguish the ordinary chips 14a and the mark chip 14b from each other by the appearance observation.

[b] Second Embodiment

The semiconductor wafer and the method for manufacturing a semiconductor device according to a second embodiment will be described with reference to FIG. 18 and FIG. 19. The same members of the present embodiment as those of the semiconductor wafer and the method for manufacturing the semiconductor device according to the first embodiment are represented by the same reference numbers not to repeat or to simplify the description.

In the semiconductor wafer according to the present embodiment, auxiliary mark chips 14c and auxiliary mark chips 14d are arranged, intersecting at the center of a shot region 12, and at the center of the shot region 12 where they cross each other, a mark chip 14b is positioned.

FIG. 18 is a view of a part of the semiconductor wafer according to the present embodiment.

In FIG. 18, the shot region 12 is indicated by the broken line.

A plurality of chip regions 14a-14d are provided in the shot region 12. For example, here, 25 chip regions 14a-14d of five rows×five columns are provided. The chip regions 14a are to be semiconductor chips which are ordinary (ordinary chips). The chip region 14b can function as a semiconductor chip which is the mark (mark chip). The chip regions (auxiliary mark chips) 14c and the chip regions (auxiliary mark chips) 14d are auxiliary regions to make the mark chip 14b distinguishable.

The auxiliary mark chips 14c are arranged along a diagonal of the shot region 12. However, at the center of the shot region 12, no auxiliary mark chip 14c is arranged.

The auxiliary mark chips 14d are arranged along a diagonal of the shot region 12, intersecting the diagonal, along which the auxiliary mark chip 14c are arranged. However, at the center of the shot region 12, no auxiliary mark chip 14d is arranged.

At the center of the shot region 12, the mark chip 14b is arranged.

As described above, in each shot region 12, with the mark chip region 14b arranged at the center, a plurality of the auxiliary mark chip region 14c are arranged in a first direction, and a plurality of the auxiliary mark chip region 14d are arranged in a second direction intersecting the first direction.

The chip regions 14a other than the mark chip regions 14b and the auxiliary mark chips 14c, 14d are the ordinary chip regions.

The size of the chip regions 14a-14d is about, e.g., 1 mm×1 mm-5 mm×5 mm. The size of the chip regions 14a-14d is set at, e.g., about 3 mm×3 mm.

After the semiconductor chips have been formed in the respective chip regions 14a-14d of the semiconductor wafer 10, dicing is made along the scribe lines SL, and the semiconductor chips 14a-14d are diced discrete.

The mark chip 14b can be used not only as the mark but also as the ordinary product.

The auxiliary mark chips 14c, 14d can be used not only as the auxiliary marks but also as the ordinary products.

The view on the upper left as viewed in FIG. 18 is an enlarged view of the circled part of a chip region 14a which is ordinary (ordinary chip region).

The view on the upper right as viewed in FIG. 18 is the enlarged view of the circled part of the chip region 14b which is the mark (mark chip region).

The view on the lower left as viewed in FIG. 18 is an enlarged view of the circled part of a chip region 14c which is an auxiliary mark (auxiliary mark chip region).

The view on the lower right as viewed in FIG. 18 is an enlarged view of the circled part of a chip region 14d which is an auxiliary mark (auxiliary mark chip region).

The device pattern 76a and the dummy patterns 76c formed in the ordinary chip region 14a are the same as the device pattern 76a and the dummy patterns 76c of the ordinary chip region 14a of the semiconductor wafer 10 according to the first embodiment.

The device pattern 76a and the dummy patterns 76d formed in the mark chip region 14b are the same as the device pattern 76a and the dummy patterns 76d of the mark chip region 14b of the semiconductor wafer 10 according to the first embodiment.

The device pattern 76a and the dummy patterns 76g, 76h formed in the auxiliary mark chip region 14c are the same as the device pattern 76a and the dummy patterns 76g, 76h of the semiconductor wafer 10 described above with reference to FIG. 17.

The plane configuration of dummy patterns 76i repeatedly arranged in the auxiliary mark chip region 14d is, e.g., a rectangle as illustrated in FIG. 18. The longitudinal directions of the dummy patterns 76i are, e.g., up-to-down as viewed in FIG. 18. The dummy patterns 76i are arranged, gradually offset obliquely to the longitudinal directions of the scribe lines SL. The arrangement direction of the dummy patterns 76i arranged, gradually obliquely offset, and the arrangement direction of the dummy patterns 76g arranged, gradually obliquely offset intersect each other.

The dummy patterns 76h for bordering arranged in the auxiliary mark chip region 14d are the same as the dummy patterns 76h for bordering in the mark chip region 14b of the semiconductor wafer 10 described above with reference to FIG. 17.

As seen in FIG. 18, the dummy patterns 76c formed in the ordinary chip region 14a and the dummy patterns 76d, 76g, 76h formed in the mark chip region 14b and the auxiliary mark chips 14c, 14d are different from each other in the configuration, the manner of the arrangement, etc. Thus, according to the present embodiment, when the semiconductor chips 14a-14d are observed, the outer appearance of the ordinary chips 14a and the outer appearance of the mark chip 14b look different. The outer appearance of the ordinary chips 14a and the outer appearance of the auxiliary mark chips 14c look different from each other. The outer appearance of the ordinary chips 14a and the outer appearance of the auxiliary mark chips 14d look different from each other. Accordingly, the arrangements formed by the mark chip 14 and the auxiliary mark chips 14c, 14d look an X-shape as a whole. Accordingly, the position of the mark chip 14 at the center of the X-shaped arrangement can be easily identified. Thus, according to the present embodiment, the semiconductor chip 14b which is the mark can be easily identified.

(Method for Manufacturing a Semiconductor Device)

Next, the method for manufacturing a semiconductor device according to the present embodiment will be described with reference to FIG. 19. FIG. 19 is a plan view of the reticle used in the method for manufacturing the semiconductor device according to the present embodiment.

The step of forming the device isolation regions 18 in the semiconductor wafer 10 to the step of forming the photoresist film 90 are the same as those of the method for manufacturing a semiconductor device described above with reference to FIGS. 4 to 8, and their description will not be repeated.

Next, the photoresist film 90 is exposed by using the reticle 92a illustrated in FIG. 19 (see FIG. 10).

FIG. 19 is a plan view of one example of the reticle.

As illustrated in FIG. 19, the pattern regions 94a for the ordinary chip, the pattern 94b for the mark chip and the pattern regions 94c, 94d for the auxiliary mark chips are formed in the reticle 92a.

The pattern regions 94a for the ordinary chip are for transferring the patterns to the ordinary chip regions 14a of the semiconductor wafer 10.

The pattern region 94b for the mark chip is for transferring the pattern to the mark chip region 14b of the semiconductor wafer 10. The pattern region 94b for the mark chip is arranged at the center of the reticle 92a.

The pattern regions 94c, 94d for the auxiliary mark chips are for transferring the patterns respectively to the auxiliary mark chip regions 14c, 14d of the semiconductor wafer 10.

In the reticle 92a, a plurality of the pattern region 94c for the auxiliary mark chip are arranged in the first direction, and a plurality of the pattern region 94d for the auxiliary mark chip are arranged in the second direction intersecting the first direction with the pattern region 14b for the mark chip as a center.

The view on the upper left as viewed in FIG. 19 is an enlarged view of the circled part of the pattern region 94a for the ordinary chip.

The view on the upper right as viewed in FIG. 19 is an enlarged view of the circled part of the pattern 94b for the mark chip.

The view on the lower left as viewed in FIG. 19 is an enlarged view of the circled part of the pattern region 94c for the auxiliary mark chip.

The view on the lower right as viewed in FIG. 19 is an enlarged view of the circled part of the pattern region 94d for the auxiliary mark chip.

The device pattern 96a and the dummy patterns 96c, etc. formed in the pattern regions 94a for the ordinary chip are formed, corresponding to the device pattern 76a and the dummy patterns 76c formed in the ordinary chip region 14a of the semiconductor wafer 10.

The device pattern 96a, the dummy patterns 96d, etc. formed in the pattern region 94b for the mark chip are formed, corresponding to the device pattern 76a and the dummy patterns 76d formed in the mark chip region 14b of the semiconductor wafer 10.

The device pattern 96a and the dummy patterns 96g, 96h of the pattern region 94c for the auxiliary mark chip are formed, corresponding to the device pattern 76a, and the dummy patterns 76g, 76h formed in the auxiliary mark chip region 14c of the semiconductor wafer 10.

The device pattern 96a, the dummy patterns 96h, 96i of the pattern region 94d for the auxiliary mark chip are formed, corresponding to the device pattern 76a and the dummy patterns 76h, 76i formed in the auxiliary mark chip region 14d of the semiconductor wafer 10.

By using such reticle 92a, the exposure of the patterns is made to the photoresist film 90. The exposure of the patterns using the reticle 92a is made sequentially to the shot regions 12.

The exposure using the reticle 92a is made on all the shot regions 12.

The process of the method for manufacturing a semiconductor device which follows hereafter is the same as that of the method for manufacturing a semiconductor device according to the first embodiment described above with reference to FIGS. 11 to 14, and its description will not be repeated.

Thus, the semiconductor device according to the present embodiment is manufactured.

Modified Embodiments

The present invention is not limited to the above-described embodiments and can cover other various modifications.

For example, the first embodiment has been described by means of the example that the number of the chip regions 14a, 14b contained in one shot region 12 is twelve. But the number is not limited to this and can be suitably set.

The second embodiment has been described by means of the example that the number of the chip regions 14a-14d contained in one shot region 12 is twenty five. But the number is not limited to twenty five and can be suitably set.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor wafer comprising:
   patterns transferred to a plurality of shot regions of the semiconductor wafer respectively,
   a plurality of chip regions being formed in the plurality of shot regions respectively, the plurality of chip regions including first chip regions functioning as ordinary semiconductor chips and a second chip region functioning as a semiconductor chip used as a mark, the second chip region being provided one for each of the plurality of shot regions, the plurality of chips regions other than the second chip region being the first chip regions,
   a plurality of first dummy patterns being formed respectively in the first chip region, the plurality of first dummy patterns being arranged repeatedly in a first manner, the first dummy patterns being not electrically connected to any interconnection layers,
   a plurality of second dummy patterns being formed respectively in the second chip region, the plurality of second dummy patterns being arranged repeatedly in a second manner different from the first manner, the second dummy patterns being not electrically connected to any interconnection layers.

2. The semiconductor wafer according to claim 1, wherein a configuration of the first dummy pattern and a configuration of the second dummy pattern are different from each other.

3. The semiconductor wafer according to claim 1, wherein an arrangement direction of the first dummy patterns and an arrangement direction of the second dummy patterns are different from each other.

4. The semiconductor wafer according to claim 1, wherein the first dummy pattern and the second dummy pattern are formed in an uppermost metal interconnection layer of a plurality of metal interconnection layers.

5. A method for manufacturing a semiconductor device comprising:
exposing sequentially each of a plurality of shot region on a semiconductor wafer by using a reticle having a plurality of pattern regions, a plurality of first dummy patterns being arranged repeatedly in a first manner in a first pattern region of the plurality of pattern regions, the first dummy patterns being not electrically connected to any interconnection layers, and a plurality of second dummy patterns being arranged repeatedly in a second manner different from the first manner in a second pattern region of the plurality of pattern regions, the second dummy patterns being not electrically connected to any interconnection layers, wherein
a plurality of chip regions are formed in the plurality of shot regions respectively, the plurality of chip regions including first chip regions functioning as ordinary semiconductor chips and a second chip region functioning as a semiconductor chip used as a mark, the second chip region being provided one for each of the plurality of shot regions, the plurality of chips regions other than the second chip region being the first chip regions.

6. The method for manufacturing the semiconductor device according to claim 5,
which further comprises, before the exposing, forming a conduction film over the semiconductor wafer; and forming a photoresist film over the conduction film,
in the exposing, the photoresist film is exposed, and
which further comprises, after the exposing, developing the photoresist film; and etching the conduction film with the photoresist film as the mask.

7. The method for manufacturing the semiconductor device according to claim 5, wherein
a configuration of the first dummy pattern and a configuration of the second dummy pattern are different from each other.

8. The method for manufacturing the semiconductor device according to claim 5, wherein
an arrangement direction of the first dummy patterns and an arrangement direction of the second dummy patterns are different from each other.

9. The method for manufacturing the semiconductor device according to claim 5, wherein
the first dummy patterns and the second dummy patterns are formed on an uppermost metal interconnection layer of a plurality of metal interconnection layers.

10. The method for manufacturing the semiconductor device according to claim 5, wherein
a number of the second pattern region is one, and
the plurality of pattern regions other than the second pattern region are the first pattern regions.

11. A semiconductor wafer comprising:
patterns transferred to a plurality of shot regions of the semiconductor wafer respectively,
a plurality of chip regions being formed in the plurality of shot regions respectively, the plurality of chip regions including first chip regions functioning as ordinary semiconductor chips and a second chip region functioning as a semiconductor chip used as a mark, the second chip region being provided one for each of the plurality of shot regions, the plurality of chips regions other than the second chip region being the first chip regions,
a plurality of first dummy patterns being formed respectively in the first chip region, the plurality of first dummy patterns being arranged repeatedly in a first manner, the first dummy patterns being not electrically connected to any interconnection layers,
a plurality of second dummy patterns being formed respectively in the second chip region, the plurality of second dummy patterns being arranged repeatedly in a second manner different from the first manner, the second dummy patterns being not electrically connected to any interconnection layers, wherein
the second dummy pattern is not formed in the first chip region, and the first dummy patterns is not formed in the second chip region.

* * * * *